United States Patent
Ferrara et al.

(10) Patent No.: US 6,992,310 B1
(45) Date of Patent: Jan. 31, 2006

(54) SCANNING SYSTEMS AND METHODS FOR PROVIDING IONS FROM AN ION BEAM TO A WORKPIECE

(75) Inventors: Joseph Ferrara, Middleton, MA (US); Michael A. Graf, Belmont, MA (US); Bo H. Vanderberg, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/917,997

(22) Filed: Aug. 13, 2004

(51) Int. Cl.
  *H01J 37/317* (2006.01)
  *H01J 37/20* (2006.01)
(52) U.S. Cl. ............................. 250/492.21; 250/442.11
(58) Field of Classification Search ............... None
  See application file for complete search history.

(56) References Cited

U.S. PATENT DOCUMENTS

| | | | |
|---|---|---|---|
| 4,700,077 A * | 10/1987 | Dykstra et al. | 250/492.2 |
| 4,922,106 A | 5/1990 | Berrian et al. | |
| 5,091,655 A | 2/1992 | Dykstra et al. | |
| 5,160,846 A | 11/1992 | Ray | |
| 5,177,366 A | 1/1993 | King et al. | |
| 5,278,420 A * | 1/1994 | Sugiyama | 250/492.21 |
| 5,780,863 A | 7/1998 | Benveniste et al. | |
| 5,898,179 A * | 4/1999 | Smick et al. | 250/492.21 |
| 6,075,249 A | 6/2000 | Olson | |
| 6,222,196 B1 * | 4/2001 | Mack | 250/492.21 |
| 6,429,442 B1 | 8/2002 | Tomita et al. | |
| 6,437,351 B1 * | 8/2002 | Smick et al. | 250/492.21 |
| 6,521,895 B1 | 2/2003 | Walther et al. | |
| 6,559,461 B1 | 5/2003 | Seo | |
| 6,677,599 B2 | 1/2004 | Berrian | |
| 6,690,022 B2 | 2/2004 | Larsen et al. | |
| 6,710,360 B2 | 3/2004 | Ferrara | |
| 6,740,894 B1 | 5/2004 | Mitchell | |

OTHER PUBLICATIONS

"NV-6208: A Midcurrent Ion Implanter With Constant Beam Angle or Incidence", Jimmy L. Fleming, Jerald P. Dykstra, Monty L. King, Andy M. Ray and Robert B. Simonton, Nuclear Instruments and Methods in Physics Research B 37/38 (1989), North Holland, Amsterdam, pp. 601-604.

* cited by examiner

*Primary Examiner*—Jack I. Berman
(74) *Attorney, Agent, or Firm*—Eschweiler & Associates, LLC

(57) ABSTRACT

Ion implantation scanning systems and methods are presented for providing ions from an ion beam to a treatment surface of a workpiece, wherein a beam is electrically or magnetically scanned in a single direction or plane and an implanted workpiece is rotated about an axis that is at a non-zero angle relative to the beam scan plane, where the workpiece rotation and the beam scanning are synchronized to provide the beam to the workpiece treatment surface at a generally constant angle of incidence.

26 Claims, 22 Drawing Sheets

SCANNING SYSTEMS AND METHODS FOR PROVIDING IONS FROM AN ION BEAM TO A WORKPIECE

RELATED APPLICATION

This application is related to U.S. patent application Ser. No. 10/917,597, filed on Aug. 13, 2004, entitled ION BEAM MEASUREMENT SYSTEMS AND METHODS FOR ION IMPLANT DOSE AND UNIFORQITY CONTROL.

FIELD OF THE INVENTION

The present invention relates generally to ion implantation systems, and more specifically to improved systems and methods for implanting ions from an ion bean to a workpiece and for measuring ion beams in ion implantation systems.

BACKGROUND OF THE INVENTION

In the manufacture of semiconductor devices and other products, ion implantation is used to dope semiconductor wafers, display panels, or other workpieces with impurities. Ion implanters or ion implantation systems treat a workpiece with an ion beam, to produce n or p-type doped regions or to form passivation layers in the workpiece. When used for doping semiconductor wafers, the ion implantation system injects a selected ion species into the wafer to produce the desired extrinsic material, wherein implanting ions generated from source materials such as antimony, arsenic or phosphorus results in n-type extrinsic material wafers, and implanting materials such as boron, gallium or indium creates p-type extrinsic material portions in a semiconductor wafer.

FIG. 1 illustrates a conventional ion implantation system 10 having a terminal 12, a beamline assembly 14, and an end station 16. The terminal 12 includes an ion source 20 powered by a high voltage power supply 22 that produces and directs an ion beam 24 to the beamline assembly 14. The beamline assembly 14 consists of a beamguide 32 and a mass analyzer 26 in which a dipole magnetic field is established to pass only ions of appropriate charge-to-mass ratio through a resolving aperture 34 at an exit end of the beamguide 32 to a workpiece 30 (e.g., a semiconductor wafer, display panel, etc.) in the end station 16. The ion source 20 generates charged ions that are extracted from the source 20 and formed into the ion beam 24, which is directed along a beam path in the beamline assembly 14 to the end station 16. The ion implantation system 10 may include beam forming and shaping structures extending between the ion source 20 and the end station 16, which maintain the ion beam 24 and bound an elongated interior cavity or passageway through which the beam 24 is transported to one or more workpieces 30 supported in the end station 16. The ion beam transport passageway is typically evacuated to reduce the probability of ions being deflected from the beam path through collisions with air molecules.

Low energy implanters are typically designed to provide ion beams of a few hundred electron volts (eV) up to around 80–100 keV, whereas high energy implanters can employ linear acceleration (linac) apparatus (not shown) between the mass analyzer 26 and the end station 16, so as to accelerate the mass analyzed beam 24 to higher energies, typically several hundred keV, wherein DC acceleration is also possible. High energy ion implantation is commonly employed for deeper implants in the workpiece 30. Conversely, high current, low energy ion beams 24 are typically employed for high dose, shallow depth ion implantation, in which case the lower energy of the ions commonly causes difficulties in maintaining convergence of the ion beam 24.

Different forms of end stations 16 are found in conventional implanters. "Batch" type end stations can simultaneously support multiple workpieces 30 on a rotating support structure, with the workpieces 30 being rotated through the path of the ion beam until all the workpieces 30 are completely implanted. A "serial" type end station, on the other hand, supports a single workpiece 30 along the beam path for implantation, whereby multiple workpieces 30 are implanted one at a time in serial fashion, with each workpiece 30 being completely implanted before implantation of the next workpiece 30 begins.

The implantation system 10 of FIG. 1 includes a serial end station 16, wherein the beamline assembly 14 includes a lateral beam scanner 36 that receives the ion beam 24 having a relatively narrow profile (e.g., a "pencil" beam), and scans the beam 24 back and forth in the X-direction to spread the beam 24 out into an elongated "ribbon" profile, having an effective X-direction width that is at least as wide as the workpiece 30. The ribbon beam 24 is then passed through a parallelizer 38 that directs the ribbon beam generally parallel to the Z-direction toward the workpiece 30 (e.g., the parallelized beam 24 is generally normal to the workpiece surface). The workpiece 30 is mechanically translated in another orthogonal direction (e.g., a "Y" direction in and out of the page in FIG. 1), wherein a mechanical actuation apparatus (not shown) translates the workpiece 30 in the Y-direction during X-direction beam scanning by the beam scanner 36, whereby the beam 24 is imparted on the entire exposed surface of the workpiece 30. For angled implants, the relative orientation of the beam 24 and the workpiece 30 may be adjusted accordingly.

In the manufacture of integrated circuit devices and other products, it is desirable to uniformly implant the dopant species across the entire workpiece 30. Accordingly, measurement systems are typically inserted in the beam path near the workpiece 30 to measure the beam characteristics prior to and/or during implantation, which provide beam dose and uniformity information used to adjust the ion implantation system 10. As the beam 24 is transported along the beam path toward the workpiece 30, the beam 24 encounters various electric and/or magnetic fields and devices that may alter the beam dimensions and/or the integrity of the beam 24, leading to non-uniformity of dopants in the implanted workpiece 30. In addition to uniformity variations, space charge effects, including mutual repulsion of positively charged beam ions, tend to diverge the beam 24 (e.g., possibly leading to beam "blowup"). In this regard, low energy ion beams 24 are particularly susceptible to beam blowup when transported over long distances. Accordingly, it is desirable to shorten the distance D1 in the system 10 of FIG. 1 between a vertex of the beam scanner 36 and the workpiece 30, particularly for low energy ion implantation.

However, simply removing the parallelizer 38 of FIG. 1 and locating the workpiece 30 a shorter distance D2 from the beam scanner vertex would result in an unacceptable variation in the angle of incidence of the beam 24 as it strikes the workpiece 30. Alternatively, the beam scanner 36 may also be omitted, in which case mechanical scanning apparatus must be provided to scan the workpiece 30 in two directions orthogonal to the path of the beam 24. However, this approach suffers from reduced throughput, particularly for uniform implants that are not beam current limited, such as low dose implants, due to the inability to scan the workpiece 30 as fast as the beam 24 can be scanned electrically or magnetically. Accordingly, there is a need for improved ion implantation systems with reduced beam transport distance to mitigate beam blowup for low energy implantation, as well as measurement apparatus for attaining acceptable implant dose and uniformity across the entire workpiece.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

The invention provides Ion beam and wafer scanning systems and methods for implanting ions from an ion beam to a treatment surface of a workpiece, wherein ions are electrically or magnetically scanned in a single direction or beam scan plane and an implanted workpiece is rotated about an axis that is at a non-zero angle relative to the beam scan plane. The workpiece rotation and the beam scanning may be synchronized to provide the beam to the workpiece treatment surface at a generally constant angle of incidence. The elimination of beam parallelizer equipment shortens the beam transport distance, thereby facilitating successful transport of low energy ion beams from the injector to the workpiece while reducing beam blowup. However, rotation of the workpiece means that the use of ordinary beam uniformity and/or dose measurement equipment would result in inaccurate measurements.

The invention also provides dosimetry systems and methods that are particularly suited for use in systems employing the above form of scanning apparatus. In such scanning systems, the scanned beam impacts the rotating wafer along a curvilinear path in a process chamber, whereby conventional dosimetry systems are unable to provide accurate beam measurements for implantation system calibration. The dosimetry systems of the invention provide for beam measurement along a curvilinear path. When used in conjunction with the scanning systems of the invention, the dosimetry system may thus advantageously take beam measurements at a number of spatial locations at which the scanned beam strikes the rotating wafer for use in adjusting of verifying implant dose and/or uniformity. The invention may thus facilitate the reduction in beam transport distance in systems having no parallelizer, without sacrificing the ability to accurately measure the beam characteristics. In addition, this invention could be used for any system where multiple degrees of freedom are required to move a faraday cup in order to measure beam flux in the surface where the ion beam is implanted into the wafer.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
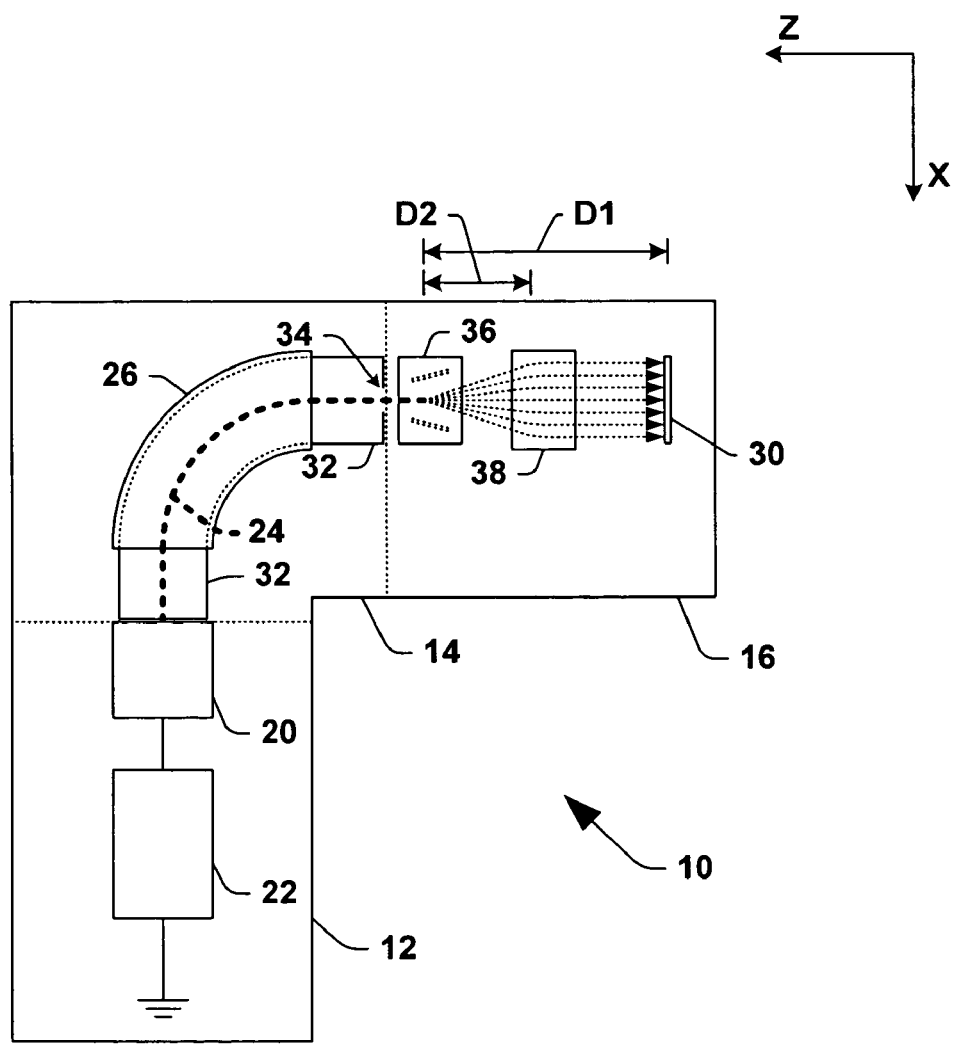
FIG. 1 is a simplified top plan view illustrating a conventional ion implantation system with a beam scanner and a parallelizer.

The present invention will now be described with reference to the drawings wherein like reference numerals are used to refer to like elements throughout, and wherein the illustrated structures are not necessarily drawn to scale.

Referring initially to FIGS. 2A–3F, various exemplary scanning systems 300 of the invention are hereinafter illustrated and described in which an ion beam 124 is scanned in a single beam scan plane, a semiconductor wafer or other workpiece 130 is mechanically oscillated or reciprocated back and forth about an axis 302 that is at a first angle relative to the beam scan plane, and the workpiece 130 is mechanically translated in a workpiece scan direction 144 that is at a second angle relative to the beam scan plane, wherein the mechanical oscillation is synchronized with electric or magnetic scanning of an ion beam 124. In the illustrated systems, the workpiece rotation axis 302 passes through the workpiece 130 itself, although other implementations are possible, for instance, wherein the workpiece 130 is rotated about another axis that does not pass through the workpiece 130 itself, but which is at a non-zero angle with respect to the beam scan plane.

Figure 4A:
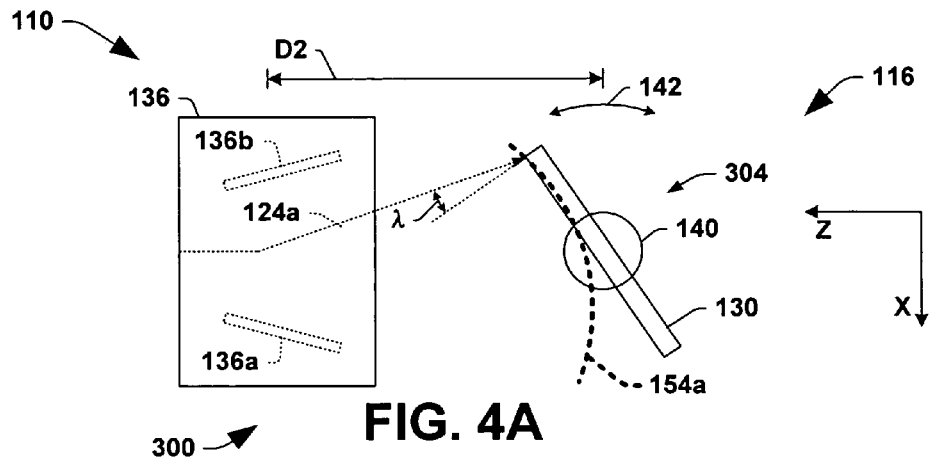
FIGS. 4A–4C are partial top plan views illustrating the beam scanner and a workpiece at three exemplary positions in the system of FIGS. 2A and 3A undergoing an angled implant along a second exemplary curvilinear path.
Figure 4B:
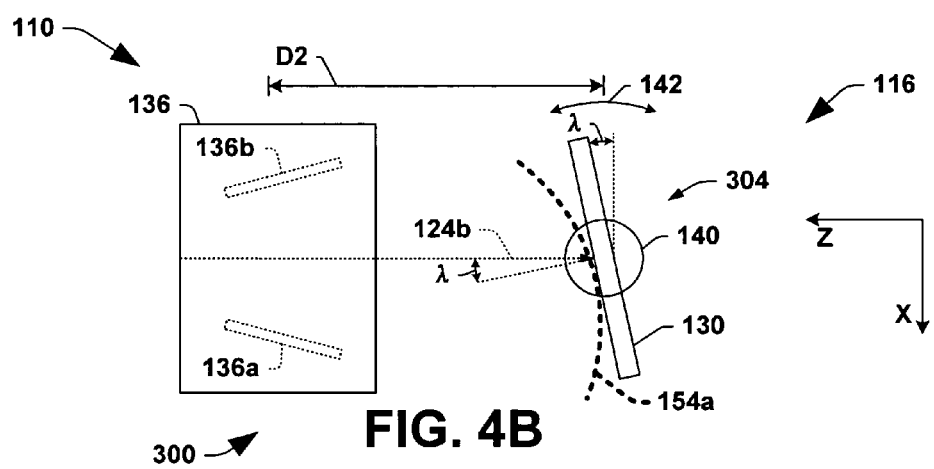
Figure 4C:
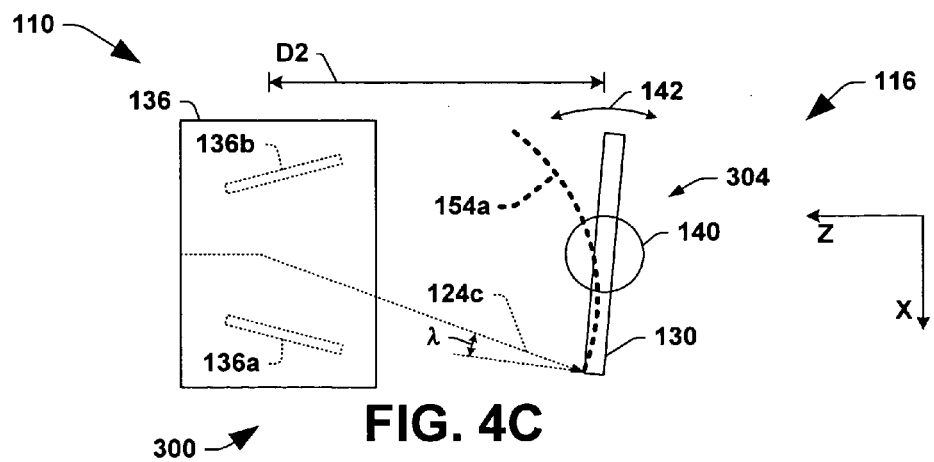

The scanning systems of the invention advantageously facilitate the beam striking the workpiece 130 at a generally constant angle of incidence without the use of intervening parallelizing apparatus, and without other shortcomings of conventional implanters. Eliminating the beam parallelizer apparatus shortens the beam transport distance between the beam scanner 136 and the workpiece 130 compared with the conventional implanter 10 of FIG. 1 above (e.g., from D1 to D2), thereby facilitating successful transport of low energy ion beams from the mass analyzer to the workpiece by reducing beam blowup. FIGS. 2A–2K and 4A–4C illustrate one example 300 of the scanning systems of the invention in which the workpiece rotation axis 302 is substantially orthogonal or perpendicular to the beam scan plane, wherein angled implants may be achieved by adding an offset to the rotation of the workpiece (FIGS. 4A–4C). Another example is illustrated in FIGS. 7A–7J, in which the workpiece rotation axis 302 and the workpiece scan direction 144 are both at oblique angles with respect to the beam scan plane for angle implants with a substantially constant beam focal distance. Still another example is illustrated in FIGS. 9A–9D, wherein the workpiece rotation axis 302 is at an oblique angle, while the workpiece scan direction 144 is orthogonal relative to the beam scan plane for an angled implant, wherein the beam focal distance changes as the workpiece 130 is translated along the workpiece scan direction. As described further below, the illustrated beam and workpiece scanning systems 300 result in curvilinear spatial paths 154 in the implantation process chamber 116, corresponding to locations where the scanned beam 124 strikes the rotating workpiece 130.

Several dosimetry or beam measurement systems 150 are also illustrated below in accordance with other aspects of the invention, wherein an ion beam 124 is measured at a plurality of points along a curvilinear path 154 at a workpiece location in a process chamber 116, thereby facilitating accurate measurement and adjustment of an ion implantation system 110 that uses the illustrated beam and workpiece scanning apparatus 300 and methodologies, or in other instances where beam measurement is desired along a curvilinear path 154. FIGS. 3A–3F and 4D–4F illustrate one example 150 of the dosimetry systems of the invention, used for measuring a beam 124 along a first curvilinear path 154 (FIGS. 3A–3F) corresponding to a non-angled implant with the scanning system 300 of FIGS. 2A–2K, as well as along a second curvilinear path 154a (FIGS. 4D–4F) corresponding to an angled implant with the scanning system 300 of FIGS. 4A–4C. The dosimetry system 150 of FIGS. 3A–3F and 4D–4F may alternatively be used in conjunction with the other modified scanning systems 300 illustrated and described herein. FIGS. 5A–5C illustrate another exemplary dosimetry system 150 that likewise may be used with any of the illustrated scanning systems 300. FIGS. 8A–8C illustrate a third exemplary dosimetry system 150 that may be advantageously employed in conjunction with the scanning systems 300 of FIGS. 2A–2K and 7A–7J for angled implants and all three exemplary scanning systems 300 for non-angled implants.

An exemplary ion implantation system 110 and an exemplary scanning system 300 therefor are illustrated in FIGS. 2A–2K, configured such that a workpiece 130 is rotated in a direction 142 (FIG. 2C) about a vertical workpiece rotation axis 302 that passes through the treatment surface of the workpiece 130 (e.g., parallel to the Y-direction in FIGS. 2B–2I) and a mass analyzed ion beam 124 is electrically or magnetically scanned along a horizontal direction (e.g., in a horizontal scan plane). The workpiece rotation and the beam scanning are synchronized to provide a first scan (e.g., a "fast scan" in a horizontal X-direction), wherein the workpiece 130 is also translated along a substantially vertical workpiece scan direction 144 (e.g., a "slow scan" in a vertical Y-direction) to achieve complete coverage of the workpiece 130 with implanted dopants. In general, the invention contemplates scanning systems 300 having an electrical or magnetic beam scanner 136 that scans an ion beam 124 substantially in a single beam scan plane (e.g., a horizontal plane in the illustrated examples), in combination with a workpiece scanning system 304 that rotates a workpiece 130 about a first axis 302 that is at any non-zero first angle relative to the beam scan plane, and that also translates the workpiece 130 in a workpiece scan direction 144 that is at a non-zero second angle relative to the beam scan plane, where the first and second angles may be the same or may be different.

Figure 2A:
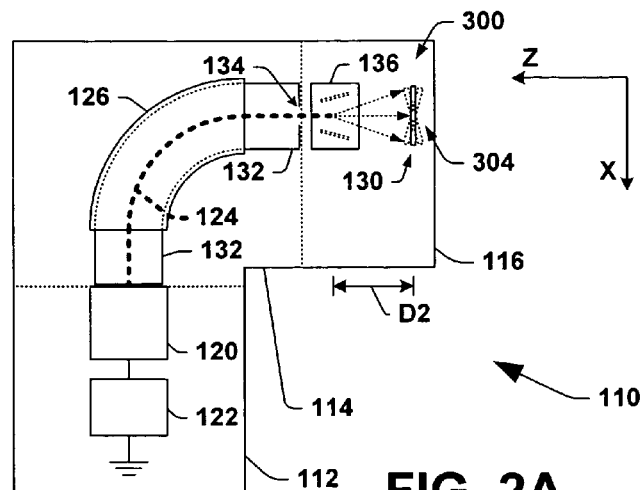
FIG. 2A is a top plan view illustrating an exemplary ion implantation system and a scanning system therefor in accordance with one or more aspects of the present invention, in which a scanned ion beam is provided to a workpiece with no intervening parallelizer, where the workpiece is rotated about an axis that passes through the workpiece.
Figure 2B:
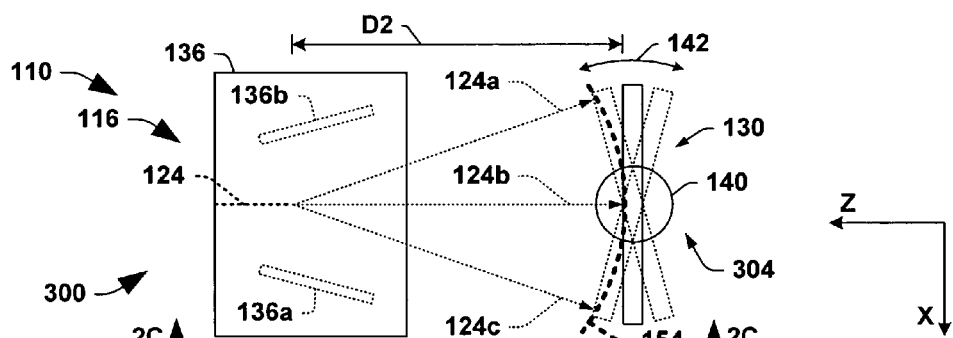
FIG. 2B is a partial top plan view illustrating a beam scanner and a rotating workpiece in the implantation system of FIG. 2A, wherein the beam scanning and the workpiece rotation define a curvilinear path corresponding to points in a workpiece location at which the scanned beam strikes the rotating workpiece.
Figure 2C:
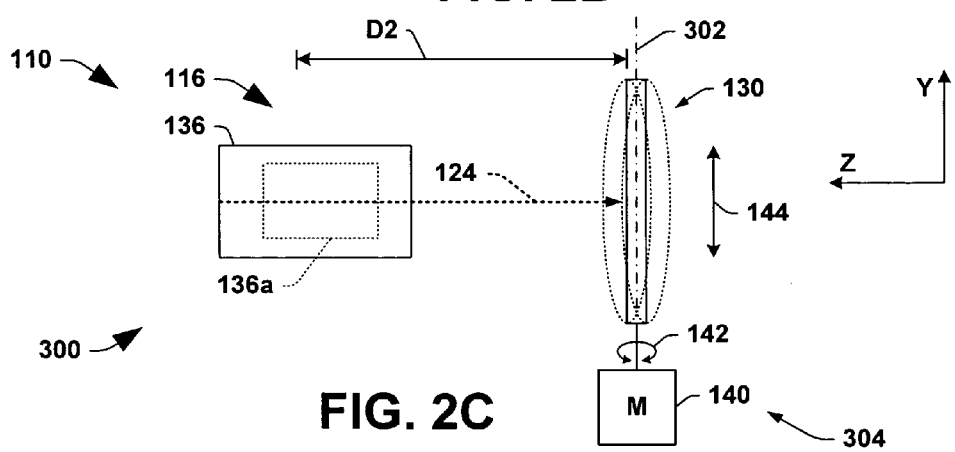
FIG. 2C is a partial side elevation view illustrating the beam scanner and the rotating workpiece in the implantation system of FIG. 2A.
Figure 2D:
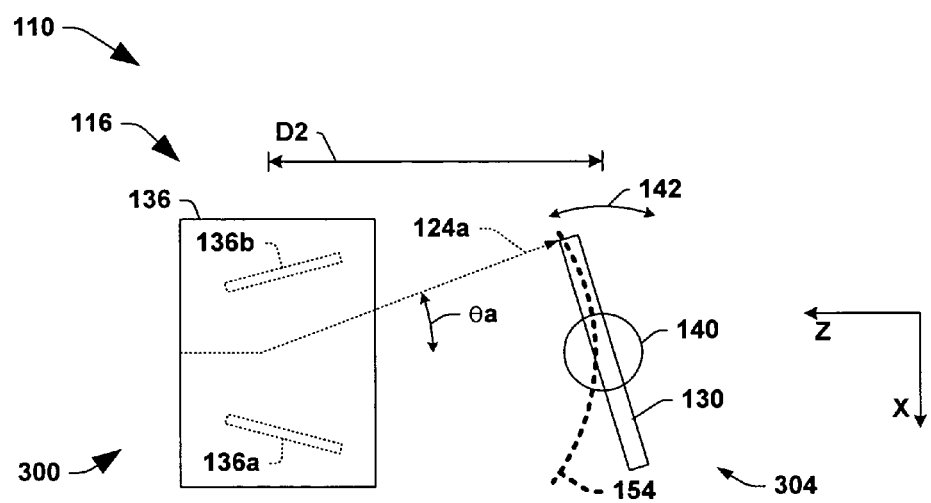
FIGS. 2D and 2E are partial top plan and side elevation views, respectively, illustrating the beam scanner and the rotating workpiece in the implantation system of FIG. 2A in an exemplary first position wherein the scanned ion beam strikes a first edge of the workpiece along the curvilinear path.
Figure 2E:
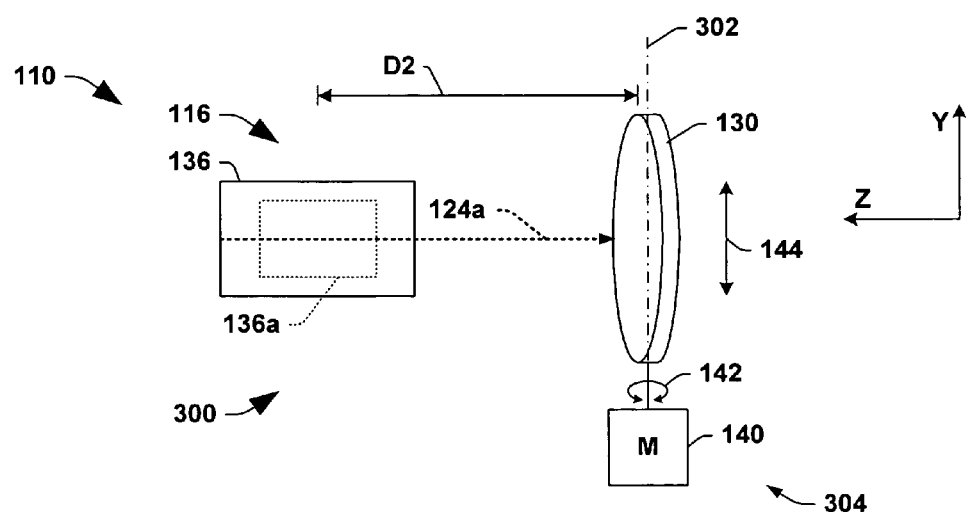
Figure 2F:
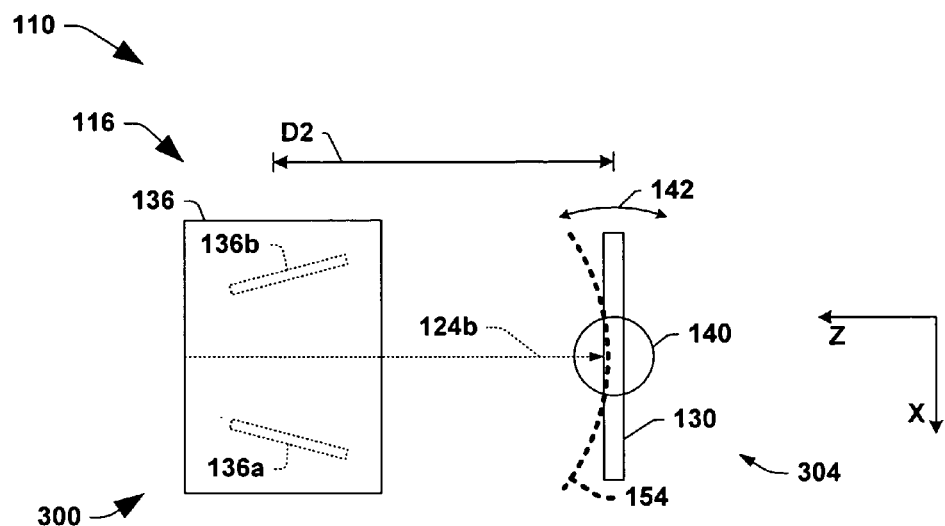
FIGS. 2F and 2G are partial top plan and side elevation views, respectively, illustrating the beam scanner and the rotating workpiece in a second exemplary position wherein the scanned ion beam strikes a center portion of the workpiece along the curvilinear path.
Figure 2G:
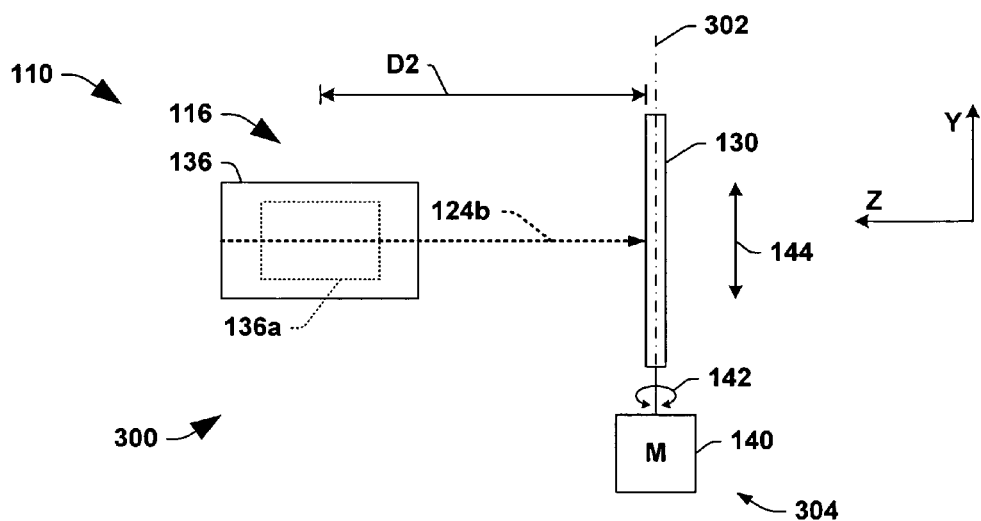
Figure 2H:
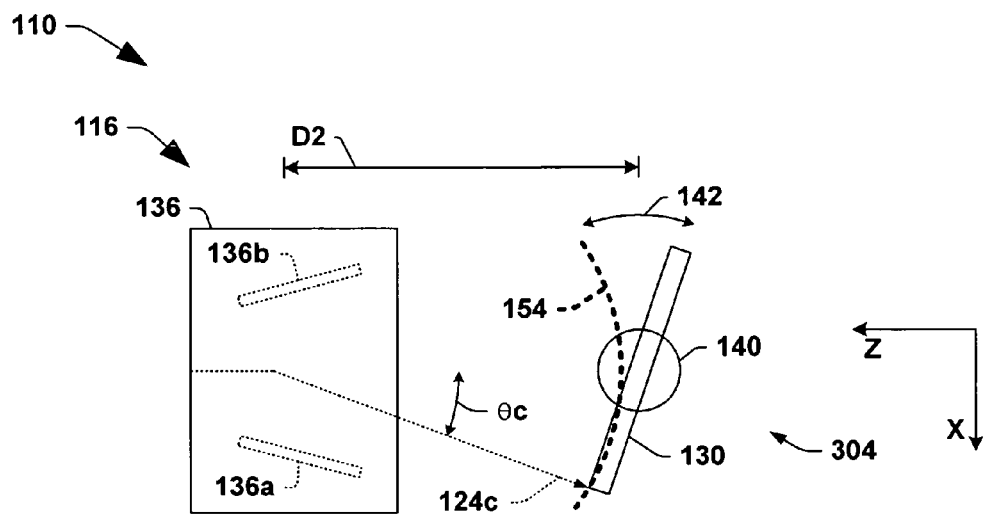
FIGS. 2H and 2I are partial top plan and side elevation views, respectively, illustrating the beam scanner and the rotating workpiece in a third exemplary position wherein the scanned ion beam strikes another edge of the workpiece along the curvilinear path.
Figure 2I:
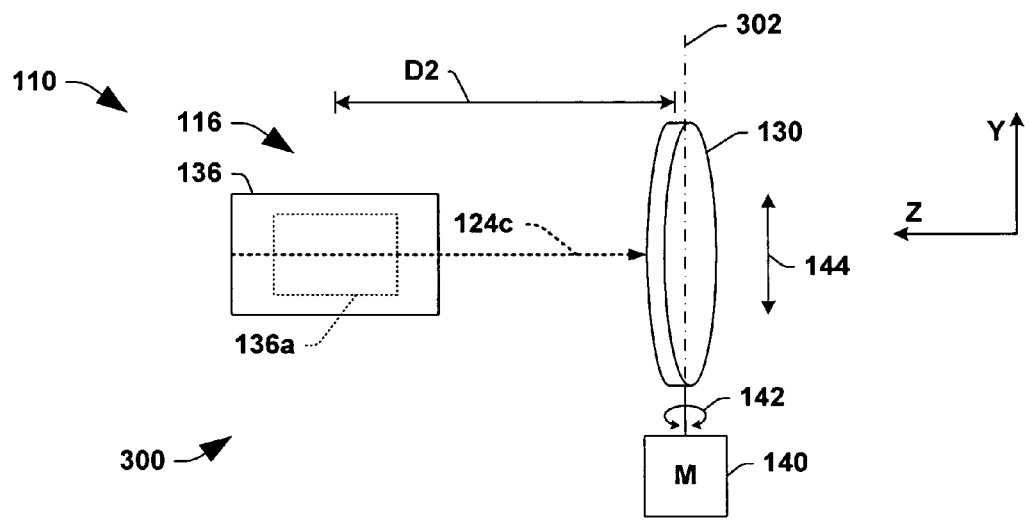
Figure 2J:
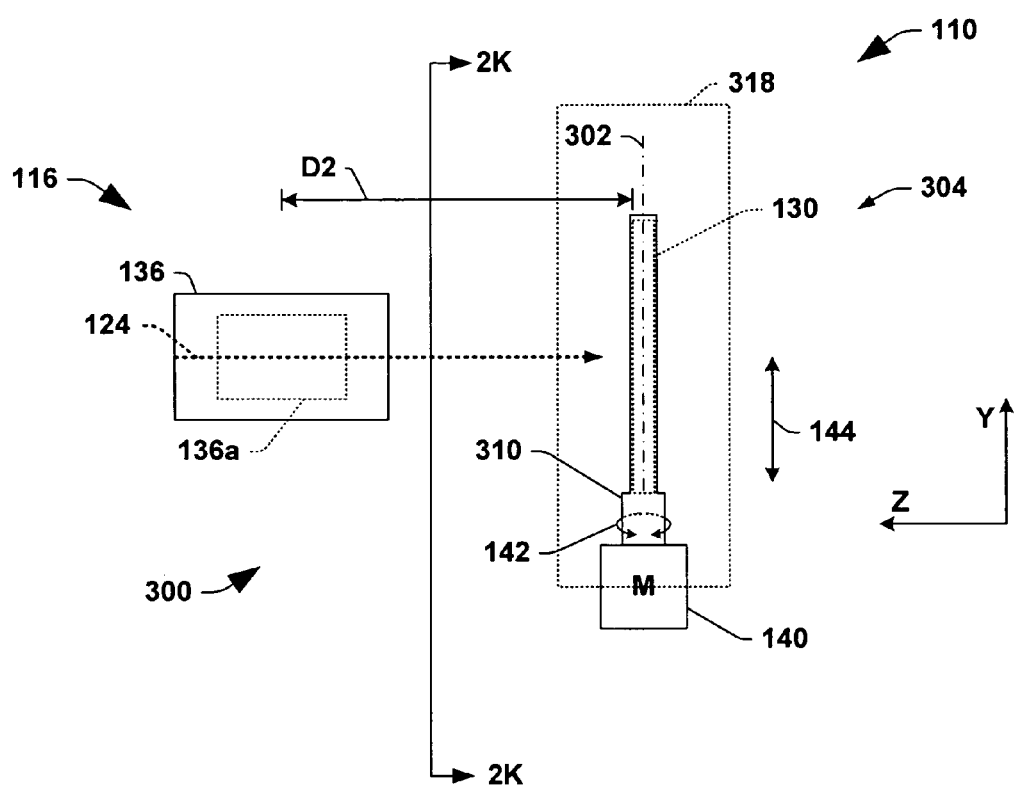
FIGS. 2J and 2K are side elevation and front elevation views, respectively, illustrating further details of the exemplary scanning system in accordance with the invention.
Figure 2K:
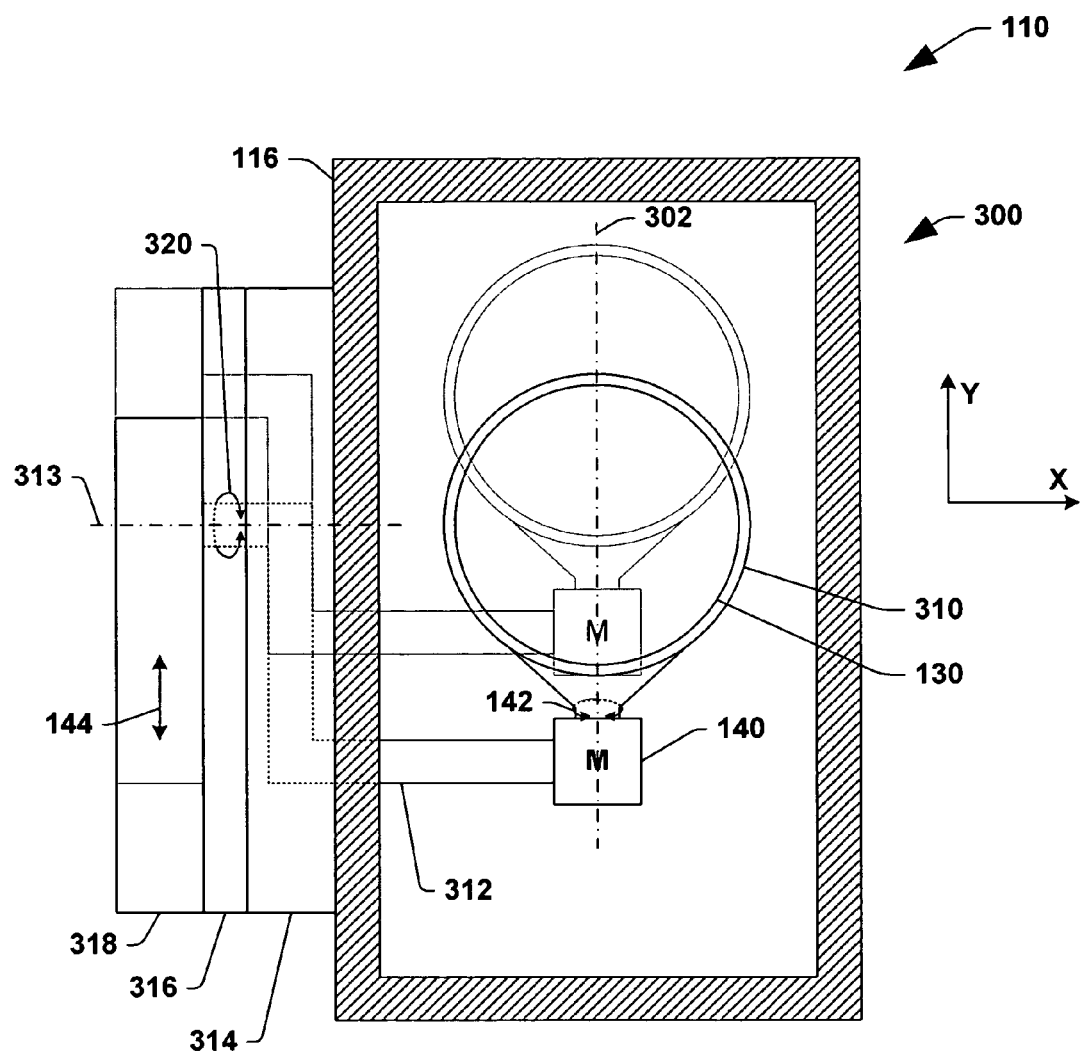
Figure 3A:
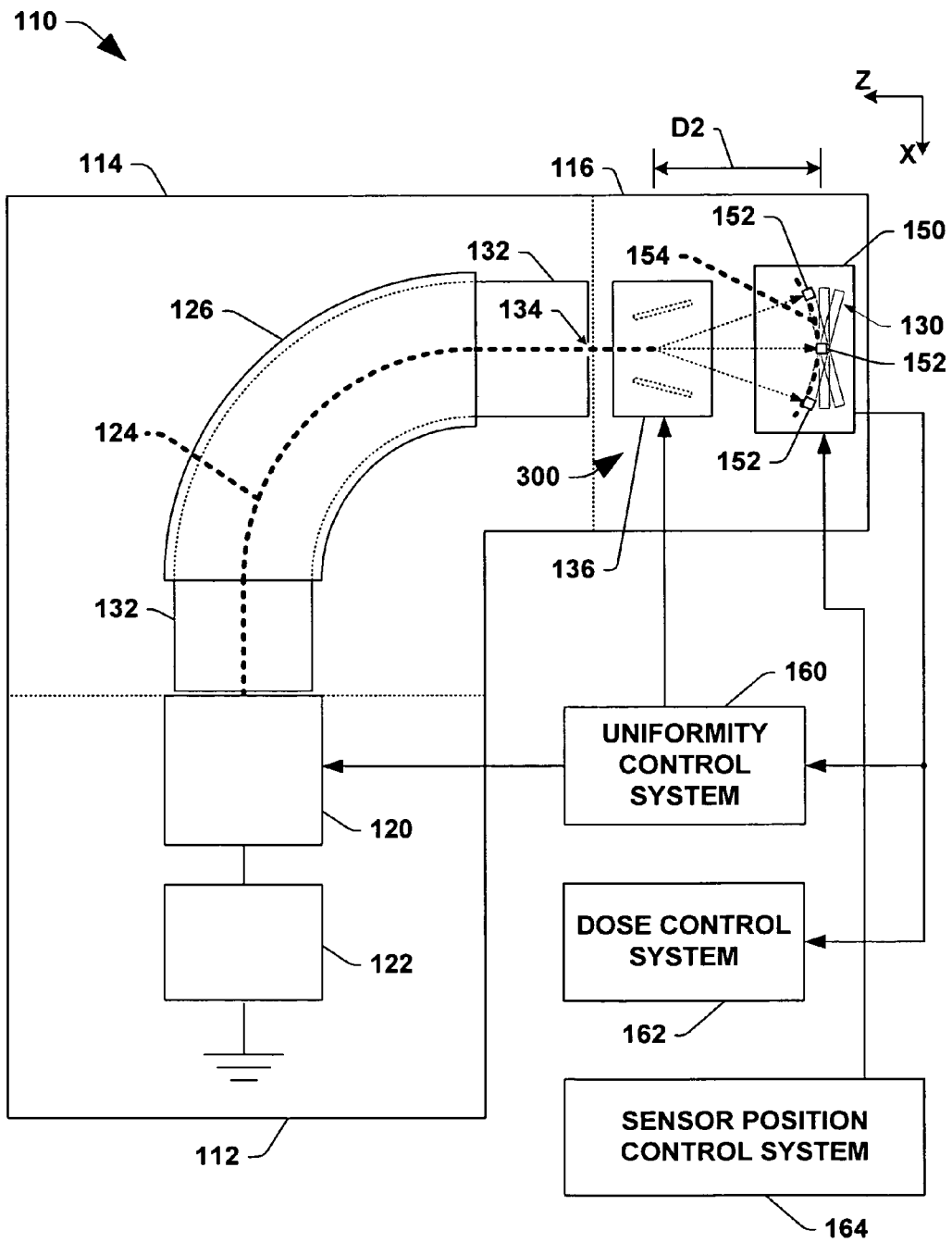
FIG. 3A is a top plan view illustrating an exemplary dosimetry system in the implantation system of FIG. 2A for measuring the scanned ion beam at a plurality of points along the exemplary curvilinear path of FIG. 2B in accordance with the invention.

FIG. 2A illustrates the ion implantation system 110 with a workpiece 130 installed in an end station process chamber 116 thereof during implantation using a scanning system 300 of the invention, and FIG. 3A illustrates the system 110 during pre-implant calibration with the exemplary dosimetry system 150 positioned in a workpiece location of the process chamber 116. FIGS. 2B–2K illustrate the synchronized scanning of the ion beam 124 in a single (horizontal) beam scan plane and rotation of the workpiece 130 about a (vertical) axis 302 during implantation, wherein the spatial points at which the beam 124 strikes the workpiece 130 define a curvilinear path 154 (e.g., non-straight line). FIGS. 3B–3F illustrate one exemplary dosimetry system 150 used to measure the beam 124 along a first curvilinear path 154 associated with a non-angled implant (e.g., where the beam 124 strikes the workpiece 130 in a direction generally normal or perpendicular to the workpiece surface).

As stated above, the various aspects of the invention may be implemented in association with any type of ion implantation apparatus, including but not limited to the exemplary system 110 of FIG. 2A. The exemplary ion implantation system 110 comprises a terminal 112, a beamline assembly 114, and an end station 116 that forms a process chamber in which a mass analyzed and scanned ion beam 124 is directed to a workpiece location. An ion source 120 in the terminal 112 is powered by a power supply 122 to provide an extracted ion beam 124 to the beamline assembly 114, wherein the source 120 includes one or more extraction electrodes (not shown) to extract ions from the source chamber and thereby to direct the extracted ion beam 124 toward the beamline assembly 114. The beamline assembly 114 comprises a beamguide 132 having an entrance near the source 120 and an exit with an exit aperture 134, as well as a mass analyzer 126 that receives the extracted ion beam 124 and creates a dipole magnetic field to pass only ions of appropriate energy-to-mass ratio or range thereof (e.g., a mass analyzed ion beam 124 having ions of a desired mass range) through the resolving aperture 134 to the workpiece 130 in a workpiece location of the end station 116. Various beam forming and shaping structures (not shown) may be provided in the beamline assembly to maintain the ion beam 124 and which bound an elongated interior cavity or passageway through which the beam 124 is transported along a beam path to one or more workpieces 130 supported in the end station 116.

As illustrated in FIGS. 2A–2K, the illustrated end station 116 is a "serial" type end station that provides an evacuated process chamber 116 in which a single workpiece 130 (e.g., a semiconductor wafer, display panel, or other workpiece) is supported along the beam path for implantation with ions, although batch or other type end stations may alternatively be employed within the scope of the invention. In accordance with an aspect of the invention, the system 110 comprises a scanning system 300 comprising a beam scanner 136 that scans the ion beam substantially in a single beam scan plane (e.g., a horizontal plane in this example) to provide a scanned ion beam to a workpiece location in the end station process chamber 116, as well as a workpiece scanning system 304.

The beam scanner 136 receives the mass analyzed ion beam 124 along the beam path from the mass analyzer 126 that has a relatively narrow profile (e.g., a "pencil" beam in the illustrated system 110), and creates time varying electric fields along the beam path via electrodes 136a and 136b (FIG. 2B) and a power source (not shown) to scan the ion beam 124 back and forth in the X-direction (e.g., in a horizontal beam scan plane) to spread the beam 124 out into an elongated "ribbon" profile (e.g., a scanned beam 124), having an effective X-direction width that is at least as wide as the workpiece 130. The non-parallelized ribbon beam 124 is directed toward the location of the workpiece 130, where the workpiece 130 is concurrently rotated in a direction 142 about a vertical axis 302 (FIG. 2C) via a motor 140 of the workpiece scanning system 304.

As illustrated in FIGS. 2B, 2C and 2J–2K, the workpiece 130 is supported in the end station 116 such that the workpiece 130 is rotatable about the axis 302 via a workpiece rotation motor 140, whereby the workpiece 130 rotates back and forth through a small angle of rotation about the axis 302 of the motor 140 in the direction 142 during implantation. Any suitable scanning system 304 may be employed to support the workpiece 130 within the scope of the invention, wherein the exemplary system 304 allows rotation of the workpiece 130 in the direction 142 and also provide translation thereof in a workpiece scan direction 144 at an angle to the beam scan plane of the scanned ion beam 124, where the direction 144 (e.g., a "slow scan" direction) is substantially perpendicular to the beam scanning plane in the configuration of FIGS. 2A–2K. Other implementations are possible, wherein the slow scan direction need not be normal to the fast scan direction (e.g., FIGS. 7A–7J below), and/or wherein the workpiece rotation axis 302 can be at an angle with respect to the slow scan direction, for example, to accomplish angled implants (e.g., FIGS. 7A–7J and 9A–9D below).

As shown in FIG. 2B, moreover, the workpiece rotation is synchronized to the beam scanner 136 such that the scanned beam 124 strikes the workpiece 130 at a generally constant angle of incidence along a curvilinear path 154. Although the exemplary curvilinear paths 154, 154a illustrated and described herein are generally arcuate, the invention contemplates dosimetry systems that are operable to measure an ion beam along any curvilinear path of any shape that is not a straight line, including but not limited to planar paths and paths that are not restricted to a single plane, and paths that may have inflection points and/or discontinuities, wherein all such systems are contemplated as falling within the scope of the invention and the appended claims.

FIGS. 2D–2I illustrate the synchronized scanning of the ion beam 124 and rotation of the workpiece 130 in the system 300 during implantation, wherein the spatial points at which the beam 124 strikes the workpiece 130 define a curvilinear (e.g., non-straight) path 154, including but not limited to the three illustrated points of incidence. FIGS. 2D and 2E illustrate the beam scanner 136 and the rotating workpiece 130 in an exemplary first scan/rotation position wherein the scanned ion beam 124a is provided at a first exemplary scan angle ⊖a, and strikes a first edge of the workpiece 130 along the curvilinear path 154. FIGS. 3F and 3G illustrate an exemplary second position wherein the scanned ion beam 124b strikes the workpiece center at a zero scan angle (not shown) along the path 154, and FIGS. 2H and 2I illustrate an exemplary third scan/rotation position, in which the beam 124c is provided at a third exemplary scan angle ⊖c so as to strike a second opposite edge of the workpiece 130 along the curvilinear path 154.

While FIGS. 2D–2I illustrate three exemplary scan/rotation positions for a non-angled implantation of the workpiece 130, the scanning/rotation will generally be a continuous synchronized motion of the beam 124 in a single horizontal beam scan plane and of the workpiece 130 in the direction 142. Alternatively or in combination, the beam 124 may be scanned in small increments, with corresponding rotation of the workpiece 130 in small increments, wherein the corresponding curvilinear path 154 may have discontinuities, and wherein all such variants or combinations thereof are contemplated within the scope of the invention and the appended claims. It is noted that the coordinated beam scanning/workpiece rotation of FIGS. 2D–2I provides a generally constant angle of incidence of the scanned beam 124 across the workpiece 130, where the angle of incidence is generally 90 degrees (e.g., the beam 124 strikes the workpiece 130 normal to the surface thereof) in the implementation of FIGS. 2D–2I. FIGS. 4A–4C below illustrate a variation of scan/rotation in the system 110, where the rotation angle of the workpiece 130 in the direction 142 is offset by a constant amount, so as to achieve an angled implant with a constant angle of incidence (e.g., the beam 124 strikes the workpiece 130 at a non-perpendicular angle along a somewhat different curvilinear path 154*a*).

Referring now to FIGS. 2J and 2K, any suitable workpiece scanning system 304 may be employed in accordance with the invention, which provides for rotation and translation of a workpiece 130 as described herein. FIGS. 2J and 2K illustrate further details of the exemplary scanning system 300 and the workpiece scanning system 304 thereof. The workpiece 130 is mounted in a workpiece support structure 310 that is coupled to a shaft of the workpiece rotation motor 140. The motor 140 is supported within the process chamber 116 via a shaft 312 that extends from the workpiece rotation motor 140 through a tilt mechanism 314 and a sliding track system 316 to a base 318 outside the process chamber 116, where shaft 312 is rotatable about an axis 313 that is substantially aligned with the front face of the workpiece. The tilt mechanism 314 is mounted to the process chamber wall 116 and the track system 316 slidingly mounts the base 318 to the tilt mechanism 314 such that the base 318, the shaft 312, the motor 140, and the workpiece support structure 310 can be translated along the workpiece scan direction 144.

As further illustrated in FIGS. 7A–7J below, the tilt mechanism 314 may be rotatably mounted to the process chamber 116 such that the track system 316, the base 318, the shaft 312, the motor 140, and the workpiece support structure 310 can be rotated about an axis that passes through the workpiece 130, whereby the workpiece scan direction 144 can be at any non-zero angle relative the to horizontal beam scan plane. Further, the shaft 312 may be rotatably mounted to the base 318, such that the shaft 312, the motor 140, and the workpiece support structure 310 can be rotated about the axis 313 of the shaft 312 in the direction 320 (FIG. 2K), such that the workpiece rotation axis 302 and the workpiece scan direction 144 may be non-parallel, as further illustrated below in FIGS. 9A–9D.

Referring also to FIGS. 3A–3F, another aspect of the invention relates to dosimetry systems and methods for measuring beam characteristics along a curvilinear path. FIG. 3A illustrates the ion implantation system 110 in a calibration setting prior to implantation of the workpieces 130. In this situation, an exemplary dosimetry system 150 is positioned in a workpiece location of the end station process chamber 116 to measure the scanned ion beam 124 along the curvilinear path 154 defined by the beam incidence on the workpiece surface. In one application, the dosimetry system 150 is used to characterize the beam dose and uniformity for adjusting or calibrating the implantation system 110, as illustrated and described further with respect to FIG. 6 below. Thereafter, the system 150 may be moved out of the workpiece location for implantation thereat of one or more workpieces 130. The exemplary dosimetry system 150 in FIG. 3A is selectively located in a workpiece location of the end station process chamber 116 prior to an implantation process, and is employed to measure the beam characteristics for calibrating or adjusting the beam dose and/or uniformity.

Once the system is calibrated, the dosimetry system 150 is removed or transferred to another location away from the workpiece location, and one or more workpieces 130 are positioned in the process chamber 116 for implantation. Other implementations of the dosimetry system aspects of the invention are possible, wherein dosimetry or measurement apparatus operates to measure a scanned ion beam along a curvilinear path, regardless of whether a workpiece 130 is being rotated, and regardless of the particular combination of beam scanning and/or workpiece translation or rotation used to effectuate uniform implantation of a workpiece 130, wherein all such variant implementations are contemplated as falling within the scope of the invention and the appended claims.

As illustrated in FIG. 3A, a uniformity control system 160 receives a sensor signal from the dosimetry system 150 and provides control signals to the ion source 120 and/or to the beam scanner 136 for adjustment of the uniformity of the ion beam 124. A dose control system 162 is provided, which also receives the sensor signal from the dosimetry system 150, and operates to control the implant dose, for example, by controlling the slow scan speed of the workpiece 130 as it is translated along the vertical workpiece scan direction 144 (FIGS. 2C, 2E, 2G, and 2I–2K above). A sensor position system 164 is also provided, which controls various motors in the dosimetry system 150 for positioning a sensor 152 along the curvilinear path 154, as discussed further below.

Figure 3B:
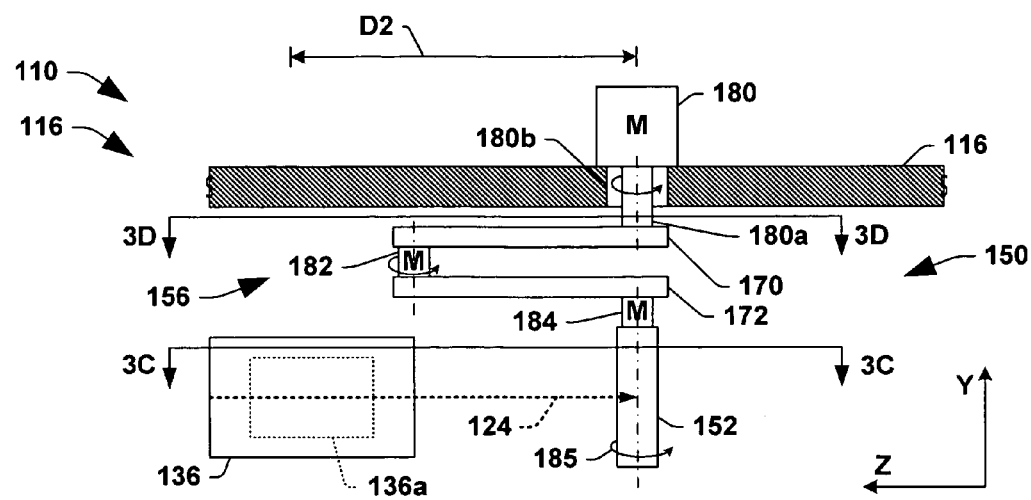
FIG. 3B is a partial side elevation view illustrating one exemplary implementation of the dosimetry system in the implantation system of FIGS. 2A and 3A, comprising a sensor and a mounting apparatus for positioning the sensor at a plurality of points along the curvilinear path.

As illustrated in FIG. 3B, the exemplary dosimetry system 150 comprises a sensor 152 and a mounting apparatus 156 for locating the sensor 152 at various points along the path 154. The sensor 152 may be any sensor that receives ions from the beam 124 and provides an output signal indicative of the amount of ions received thereat. In the exemplary dosimetry system 150, the sensor 152 is a Faraday cup or dosimetry cup (e.g., sometimes referred to as a dose cup) having an entrance aperture through which ions are received from the beam 124, wherein the mounting apparatus 156 supports the sensor 152 and selectively positions the sensor 152 at a plurality of points along the curvilinear path 154 for measuring the beam 124.

It is noted that this selective positioning of the sensor 152 advantageously facilitates accurate sensing or measurement of the beam 124 characteristics seen by a workpiece 130 during implantation. In this regard, the inventors have appreciated that positioning one or more sensors along a straight line or path would result in inaccurate beam measurement where the beam strikes a workpiece on a curvilinear path, whereby adjustments to the beam dose or uniformity (e.g., changes to the ion source 120, the beam scanner 136, and/or to the slow scan speed in the end station 116) based on such straight-line measurements may be insufficient to achieve the precise control over the dopant dose and uniformity requirements of modern semiconductor fabrication or other implantation processes.

FIGS. 3B–3F illustrate one implementation of the dosimetry system 150, including a single Faraday cup sensor 152, with a mounting apparatus 156 for selective positioning of the sensor 152 along the curvilinear path 154. In this case, the mounting apparatus 156 includes various motors controlled and powered by the sensor position control system 164 of FIG. 3A, which may be located inside the end station process chamber 116 or may be external thereto, wherein signal, power and other facilities (e.g., control cabling and support structures therefor, not shown) is provided for the various motors of the mounting apparatus 156 along with sensor wiring, which may be passed through the walls of the evacuated process chamber 116 using any suitable hermetically sealed pass-thru devices for connection to an external control system 164 and to provide a sensor output signal to the systems 160 and 162. In this regard, the motors and support members of the mounting apparatus may provide interior passages (e.g., may be hollow shaft structures) to allow signal, power, and control wires and other facilities to be passed from the interior of the process chamber to the exterior without compromising the hermetic seal therebetween.

The mounting apparatus 156 of FIG. 3B comprises first and second horizontally extending elongated support members 170 and 172, as well as first, second, and third rotary motors 180, 182, and 184, respectively. The first motor 180 includes a shaft 180a passing through an upper process chamber wall of the end station 116 via a vacuum seal 180b to rotatably support the first support member 170 inside the process chamber 116. The first support member 170 has a first end coupled to the shaft 180a and a second opposite end that is thus rotatable relative to the process chamber 116 about the axis of the first motor 180. The second end of the first member 170 is pivotally mounted to a first end of the second support member 172 via the second rotary motor 182 such that the second support member 172 can rotate relative to the first support member 170 about the axis of the second motor 182. The sensor 152 is mounted to the second support member 172, wherein the support members 170, 172 can be rotated relative to one another and to the process chamber 116 via the motors 180 and 182 so as to position the sensor 152 at a plurality of points along the curvilinear path 154.

Figure 3C:
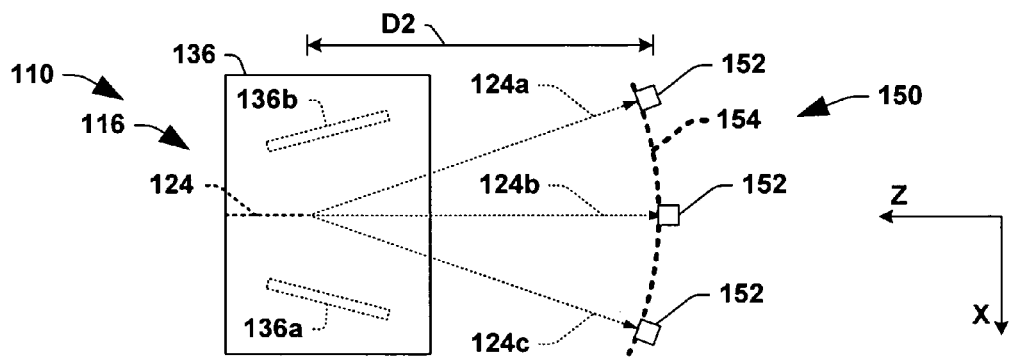
FIG. 3C is a partial top plan view illustrating the dosimetry system sensor positioned at three exemplary points along the curvilinear path of FIG. 2B in the implantation system of FIGS. 2A and 3A.
Figure 3D:
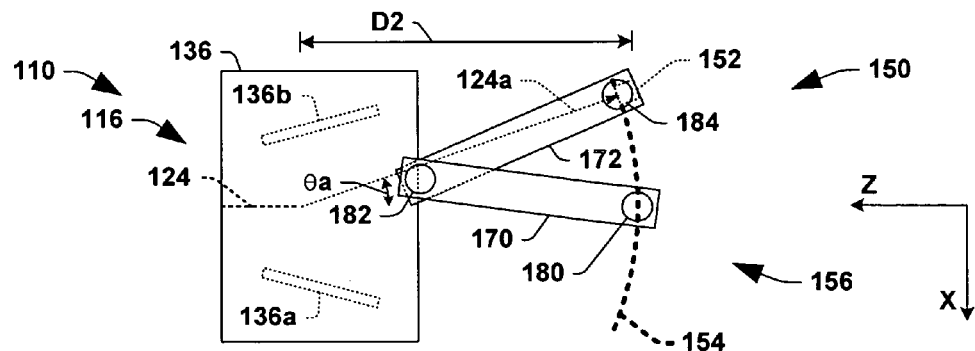
FIGS. 3D–3F are partial top plan views illustrating the dosimetry system of FIG. 3B with the sensor positioned at exemplary points along the curvilinear path in the implantation system of FIGS. 2A and 3A.
Figure 3E:
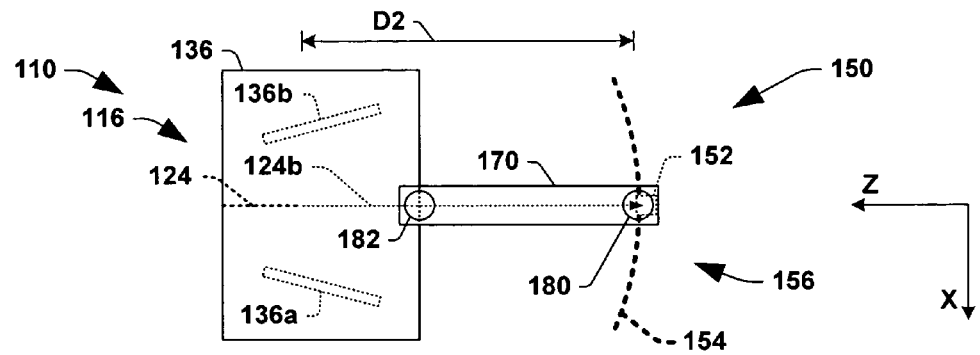
Figure 3F:
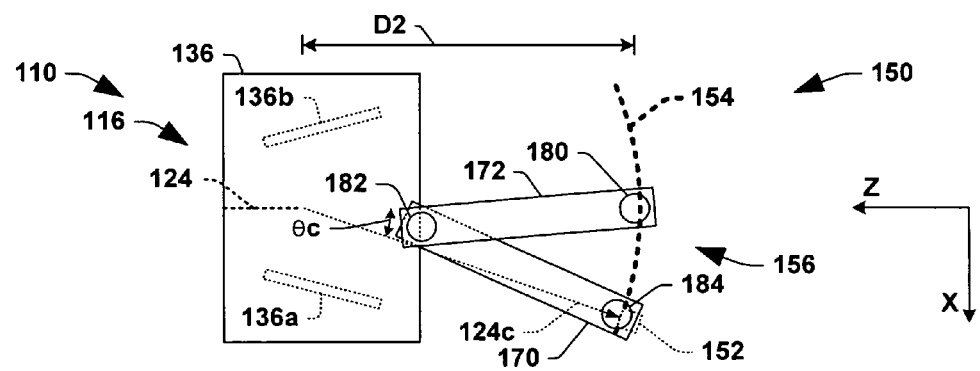

FIG. 3C illustrates the sensor 152 positioned by the mounting apparatus 156 at three exemplary points along the curvilinear path 154 for measuring the ion beam 124a, 124b, 124c thereat. The exemplary mounting apparatus 156 of FIG. 4B also comprises a third motor 184 that pivotally mounts the sensor 152 to the second end of the second member 172, thus allowing the sensor 152 to be rotated in a direction 185 such that the entrance aperture of the sensor 152 is pointed toward a vertex of the scanned ion beam 124 via the third motor 184. Although FIG. 3C illustrates only three exemplary points or positions of the sensor 152 along the path 154, the apparatus 156 may be employed to successively locate the sensor 152 at any suitable number of such points along the illustrated path 154 or other curvilinear paths for measuring the attributes of the scanned ion beam 124. FIGS. 3D–3F illustrate operation of the mounting apparatus 156 in positioning the sensor 152 at the three exemplary points of FIG. 3C along the path 154 via the motors 180 and 182, as well as positioning the sensor 152 with the entrance aperture thereof facing the vertex of the beam 124 via the third motor 184.

Referring also to FIGS. 4A–4F, the exemplary scanning system 300 and the dosimetry system 150 may also be employed in situations where it is desirable to implant dopants in a workpiece at an angle other than 90 degrees (e.g., angled implants), as is often the case in semiconductor device fabrication. FIGS. 4A–4C illustrate the beam scanner 136 of the scanning system 300 and the workpiece 130 at three exemplary scan/rotation positions undergoing an angled implant along a second exemplary curvilinear path 154a, wherein the rotation angle of the workpiece 130 is offset in the direction 142 by a constant angle A, so as to achieve an angled implant, again with the workpiece rotation axis 302 and the workpiece scan direction substantially vertical (e.g., perpendicular to the beam scan plane). In this manner, the beam 124 strikes the workpiece 130 at a non-perpendicular angle along a path 154a that is somewhat different than the path 154 for a non-angled implant above.

Figure 4D:
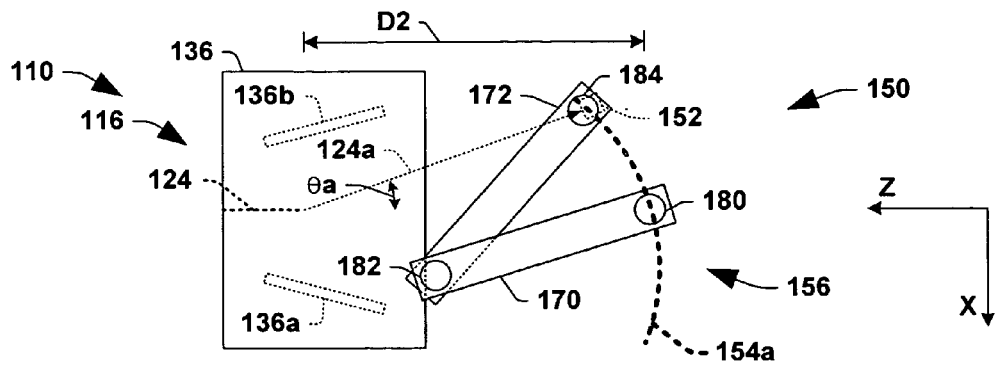
FIGS. 4D–4F are partial top plan views illustrating the dosimetry system of FIG. 3B with the sensor positioned by the mounting apparatus at different exemplary points along the second curvilinear path of FIGS. 4A–4C for beam measurement prior to angled implantation in the system of FIGS. 2A and 3A.
Figure 4E:
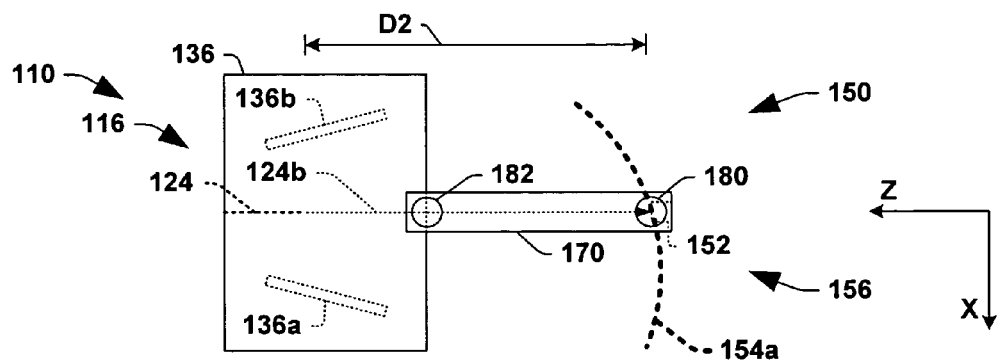
Figure 4F:
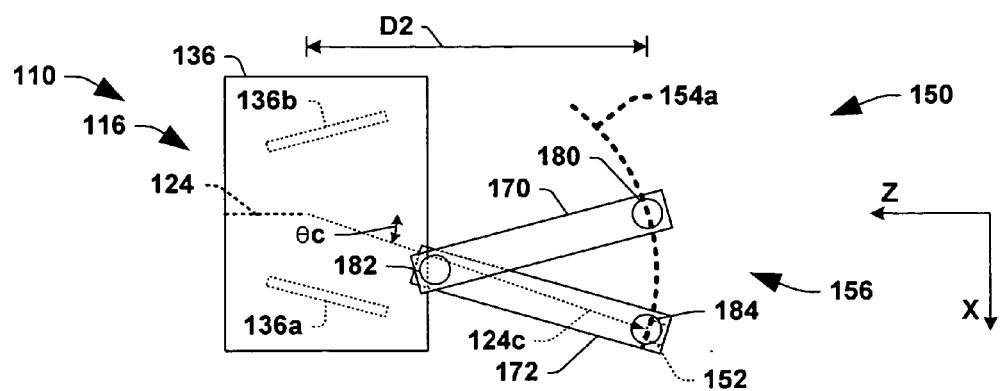
Figure 5A:
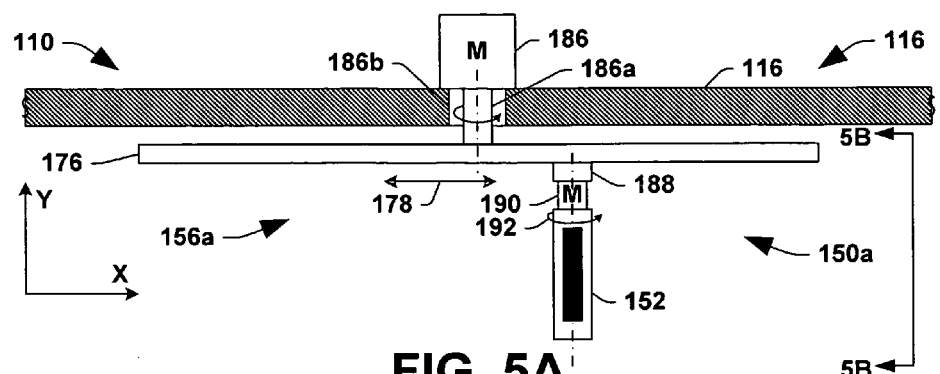
FIGS. 5A–5C are end elevation, side elevation, and top plan views, respectively, illustrating another exemplary dosimetry system in the implantation system of FIGS. 2A and 3A in accordance with the invention.
Figure 5B:
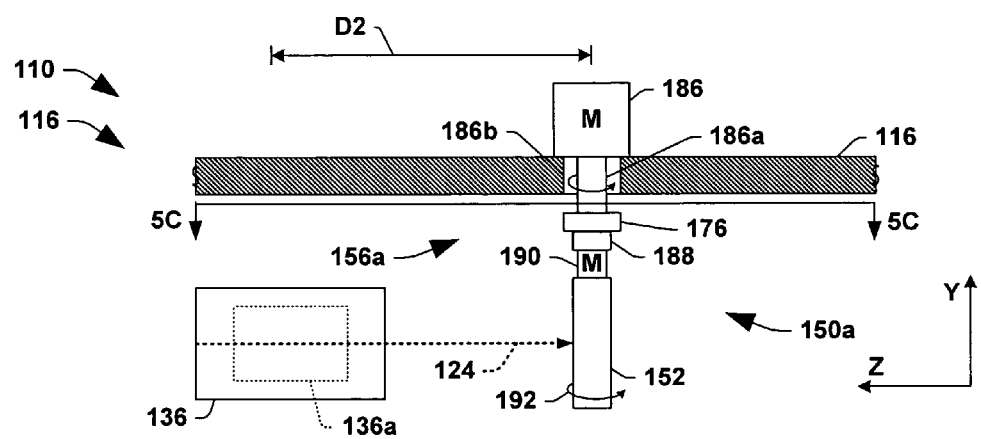
Figure 5C:
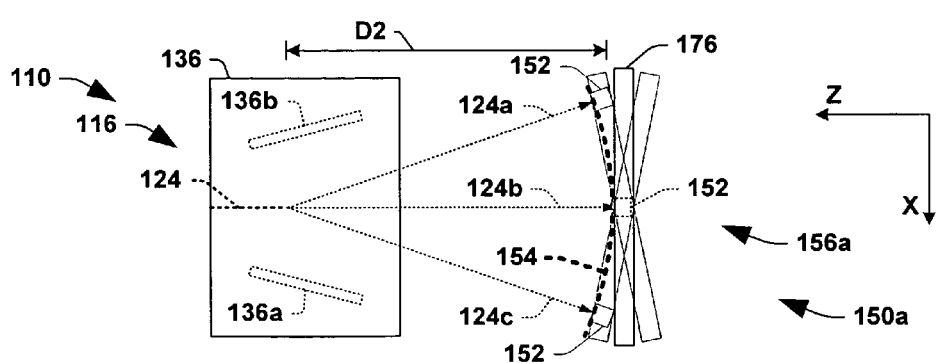

FIGS. 4D–4F illustrate the positioning of the sensor 152 using the dosimetry system 150 at the exemplary three points along the second curvilinear path 154a via the mounting apparatus 156. It is noted that the exemplary mounting apparatus 156 and the corresponding position control system 164 (FIG. 3A) may be employed to locate a sensor 152 along any curvilinear path in the workpiece location of the process chamber 116, whereby the dosimetry systems 150 of the invention may be employed in any implantation system to measure beam characteristics along any curvilinear path. Other implementations are possible, for example, wherein the dosimetry system mounting apparatus provides for sensor translation in three dimensions within the process chamber 116 along a curvilinear path that is not limited to a single plane. In other variants, the ion beam 124 may be electrically or magnetically scanned in multiple directions, wherein the dosimetry system mounting apparatus may be designed to selectively position the sensor 152 at a plurality of points along a more complex curvilinear path than those illustrated and described herein. Another possible implementation could involve the workpiece 130 being tilted or rotated about an axis parallel to the illustrated X-direction for angled implants (e.g., FIGS. 7A–9D below), in which the workpiece scan direction 144 is not strictly vertical, wherein the dosimetry system mounting apparatus may be designed to locate the sensor 152 along a curvilinear path corresponding to the points where the beam 124 strikes the workpiece 130. In addition, the dosimetry system 150 may include more than one sensor 152 with associated mounting apparatus 156 for measuring a scanned beam 124 along a curvilinear path 154, wherein all such variant implementations are contemplated as falling within the scope of the present invention and the appended claims.

One such alternative dosimetry system implementation is illustrated in FIGS. 5A–5C, wherein a dosimetry system 150a is located within the process chamber 116 for beam measurement. In the system 150a, a sensor 152 is provided together with a mounting apparatus 156a that is different than that of the system 150 described above. As illustrated in FIG. 5A, the mounting apparatus 156a comprises an elongated track 176 pivotally mounted to the upper wall of the process chamber 116 by a first motor 186 having a shaft 186a extending to the process chamber interior through a seal 186b. The track 176 has first and second opposite ends, and can be rotated relative to the process chamber 116 about the axis of the first motor 186.

The sensor 152 is slidingly mounted to the track 176 by a second motor 188, which is a linear actuator or linear motor, such that the sensor 152 can be positioned along a direction 178 anywhere along the track 176, whereby the rotation of the track 176 via the first motor 186 and the translation of the sensor 152 along the track 176 via the second motor 188 allow the sensor 152 to be positioned at a plurality of points along the curvilinear path 154 illustrated in FIG. 2B above (for a non-angled implant calibration) at the workpiece location in the process chamber 116, or points along the exemplary second curvilinear path 154a of FIGS. 4A–4F above (for an angled implant calibration), or for any other planar curvilinear path, wherein further vertical positioning apparatus (not shown) may be provided to accommodate non-planar curvilinear paths. Also, the exemplary dosimetry system 150a comprises a third motor 190 that rotatably mounts the sensor 152 to the track 176 about a second axis, allowing the sensor 152 to be rotated relative to the track 176 in a direction 192 to point the entrance aperture of the sensor 152 toward the vertex of a scanned ion beam 124.

Figure 6:
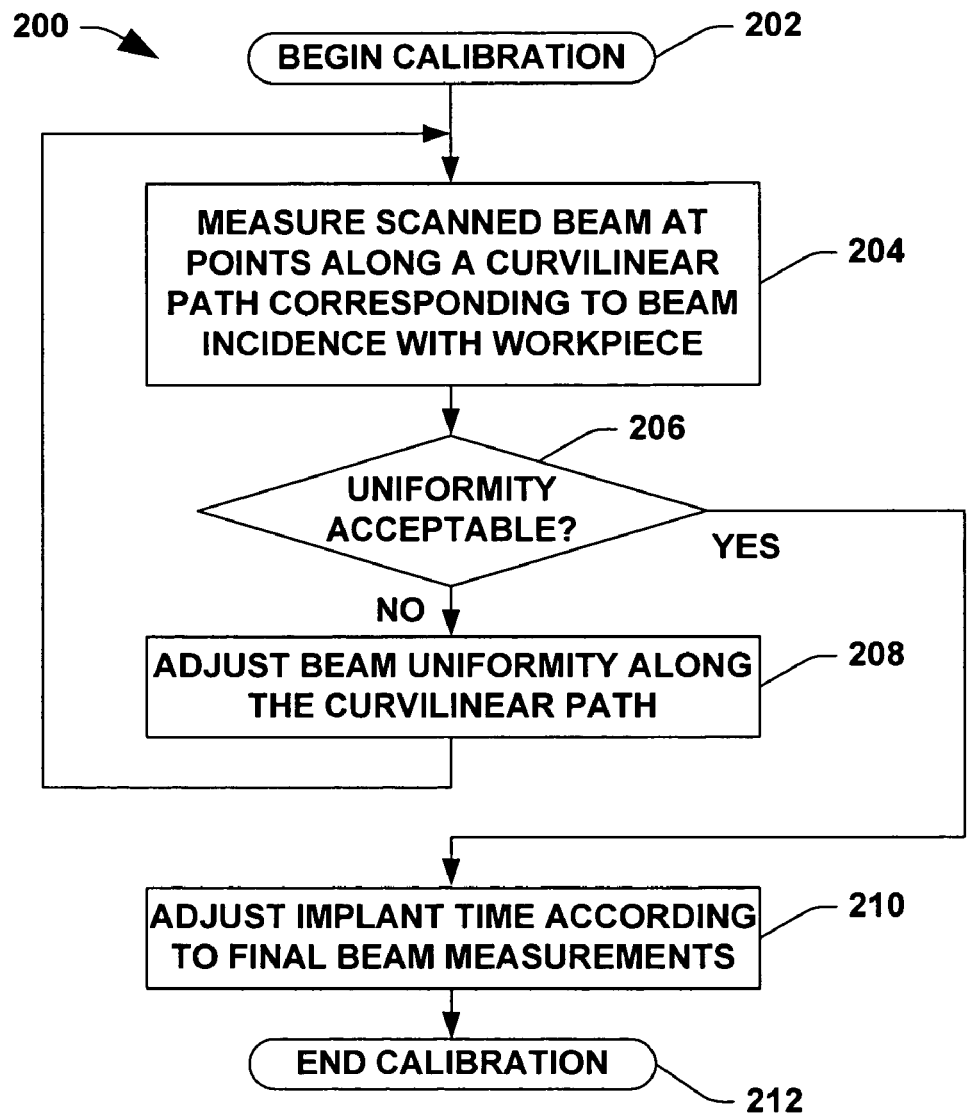
FIG. 6 is a flow diagram illustrating an exemplary calibration process including measurement of a scanned ion beam in a process chamber in accordance with the present invention.

Referring also to FIG. 6, another aspect of the invention provides methods for measuring a scanned beam in a process chamber, wherein FIG. 6 illustrates an exemplary calibration process 200 including measurement of a scanned ion beam in along a curvilinear path in accordance with the present invention. While the beam measurement techniques in the calibration process 200 are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the implantation and dosimetry systems illustrated and described herein as well as in association with other structures not illustrated.

The implantation system calibration 200 begins at 202, where a scanned ion beam is measured at 204 along a curvilinear path corresponding to the beam incidence with a workpiece (e.g., paths 154, 154a above). Referring also to FIGS. 3A–3F, in one implementation, the beam measurement at 204 comprises directing a scanned ion beam (beam 124 in FIG. 3A) toward a workpiece location in a process chamber (end station 116), and measuring the scanned beam 124 at a plurality of points along a curvilinear path (e.g., path 154) at the workpiece location, as illustrated in FIGS. 3C–3F. To make the measurements, a sensor is provided (sensor 152), and is selectively positioned at the plurality of points along the curvilinear path 154 to measure the scanned ion beam 124 using the mounting apparatus 156 (FIGS. 3D–3F). In addition, the selective positioning of the sensor 152 may comprise positioning the sensor 152 such that an entrance aperture thereof faces a vertex of the scanned ion beam 124, for example, using the third motor 184 of FIG. 3B.

In the exemplary system 110 of FIG. 3A, the sensor output signals are provided to the uniformity control system 160 and to the dose control system 162. A determination is made at 206 as to whether the measurements indicate acceptable beam uniformity along the curvilinear path of beam/workpiece incidence. If not (NO at 206), the beam uniformity control system 160 may adjust one or both of the ion source 120 and the beam scanner 136 at 208 to bring the incident beam uniformity closer to a target or desired value or range, and the measurements are repeated at 204. This measurement/adjustment process may be repeated any number of times until the uniformity is found to be acceptable at 206. At that point (YES at 206), the implant time is adjusted at 210 according to the most recent beam measurements. In the system 110 of FIG. 3A, the dose control system 162 adjusts the implant time by changing the slow scan speed of the workpiece 130 in the direction 144 (FIG. 2C), wherein reducing the slow scan speed increases the workpiece implantation dose and increasing the speed decreases the dose. With the dose and uniformity adjustments having been made, the calibration 200 ends at 212, and the dosimetry system 150 is removed from the workpiece location of the end station process chamber 116. Thereafter workpieces 130 are loaded into the process chamber 116, and implantation proceeds as described above, wherein further real-time sensors (not shown) may be situated in the chamber 116 to measure the beam (e.g., in overscan regions of the scanned beam trajectory) to determine if small adjustments are appropriate during implantation.

Referring now to FIGS. 2K and 7A–7J, another exemplary implementation of the scanning system 300 is illustrated in the implanter 110 to provide for angled implants, wherein the tilt mechanism 314 (FIG. 2K) is rotatably mounted to the process chamber 116 such that the track system 316, the base 318, the shaft 312, the motor 140, and the workpiece support structure 310 can be rotated about an axis that pass through the workpiece 130, whereby the workpiece scan direction 144 can be at any non-zero angle relative the to horizontal beam scan plane. This example facilitates implantation of ions to the workpiece 130 at a generally constant (e.g., non-perpendicular) angle relative to the treatment surface of the workpiece 130, together with workpiece scanning along the direction 144 that maintains a substantially constant focal length from the beam scanner 136 to the workpiece 130. In this regard, the rotation of the tilt mechanism 314 controllably sets the workpiece rotation axis 302 at an oblique angle relative to the horizontal beam scan plane, while maintaining the workpiece scan direction 144 parallel to the workpiece rotation axis 302 (e.g., FIG. 7J).

Figure 7A:
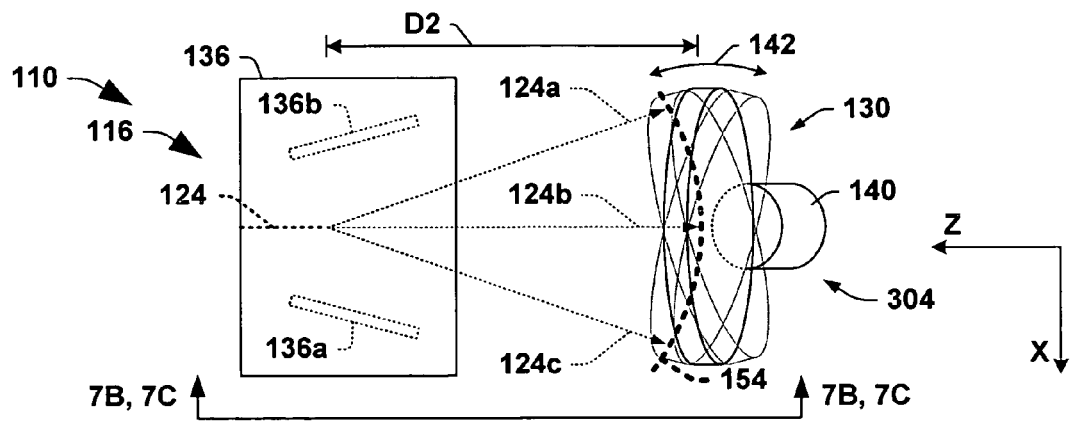
FIGS. 7A–7J are top plan and side elevation views illustrating another exemplary scanning system in accordance with the invention, wherein the wafer rotation axis and wafer scan direction are tilted relative to the beam scan plane, so as to provide for angled implantation of the workpiece with a constant beam focal distance.
Figure 7B:
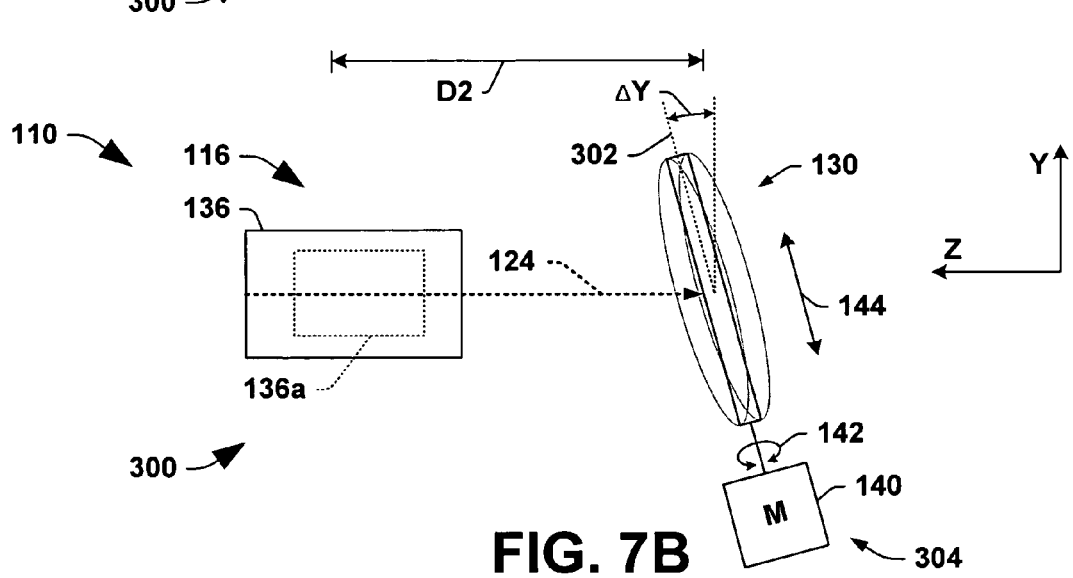
Figure 7C:
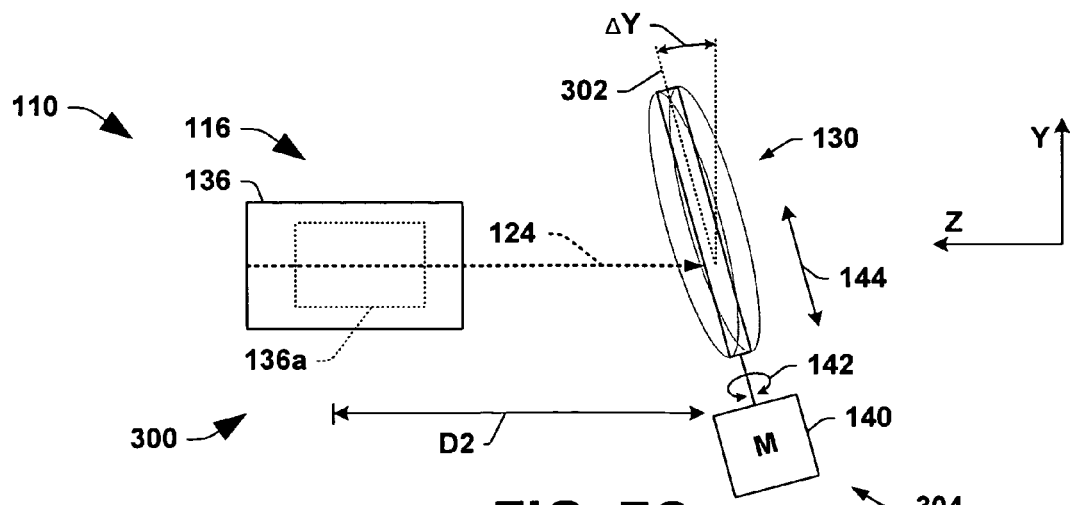
Figure 7D:
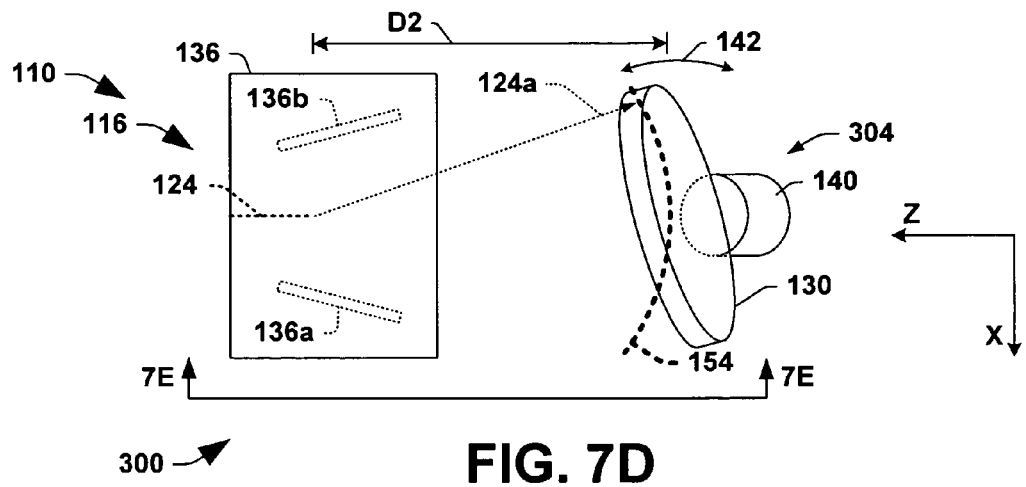
Figure 7E:
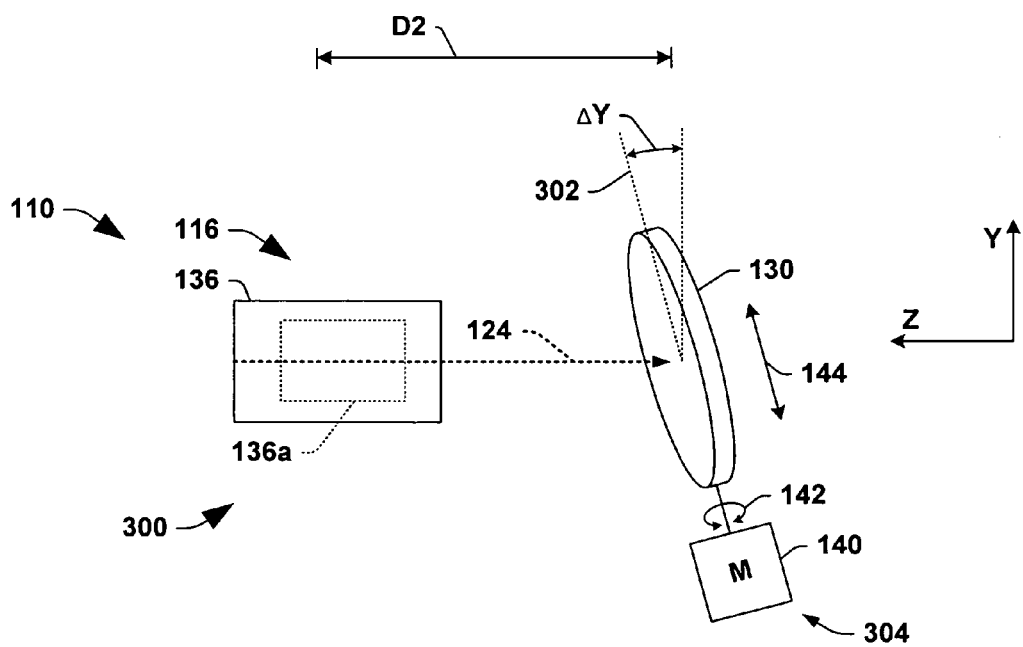
Figure 7F:
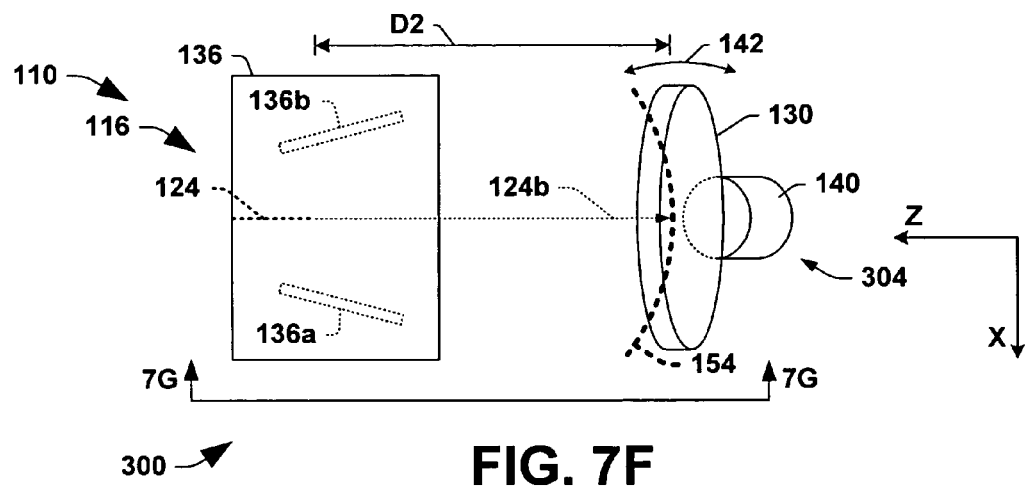
Figure 7G:
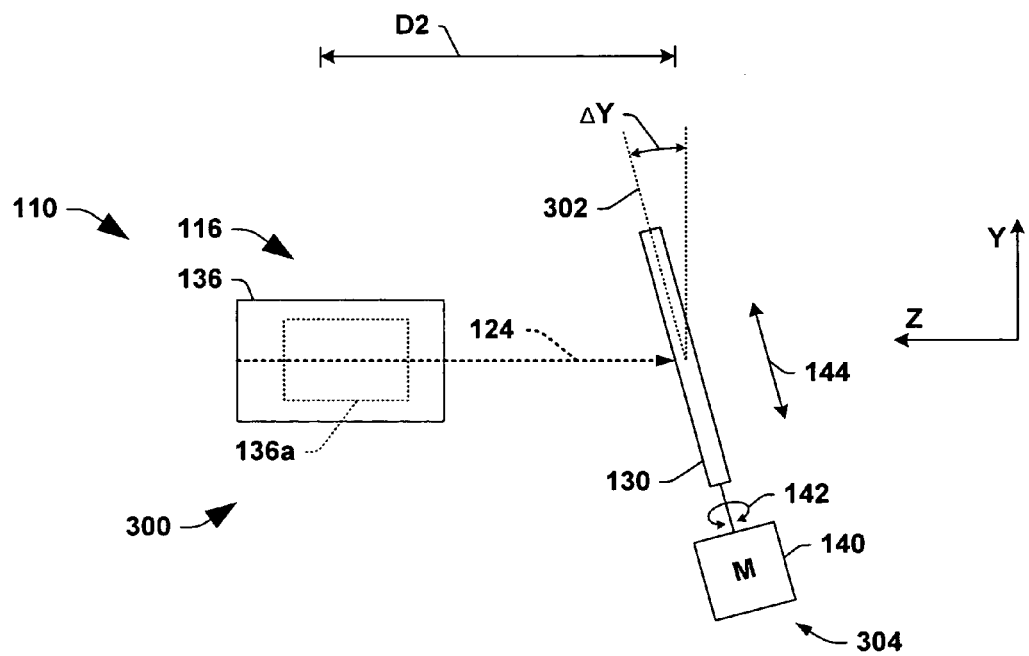
Figure 7H:
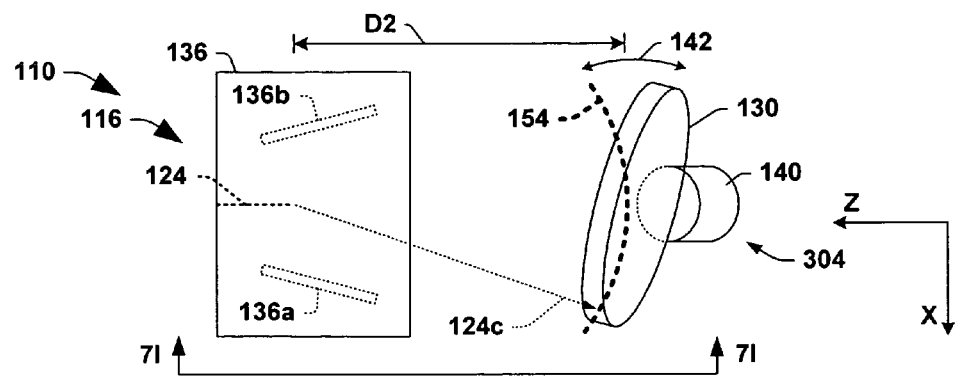
Figure 7I:
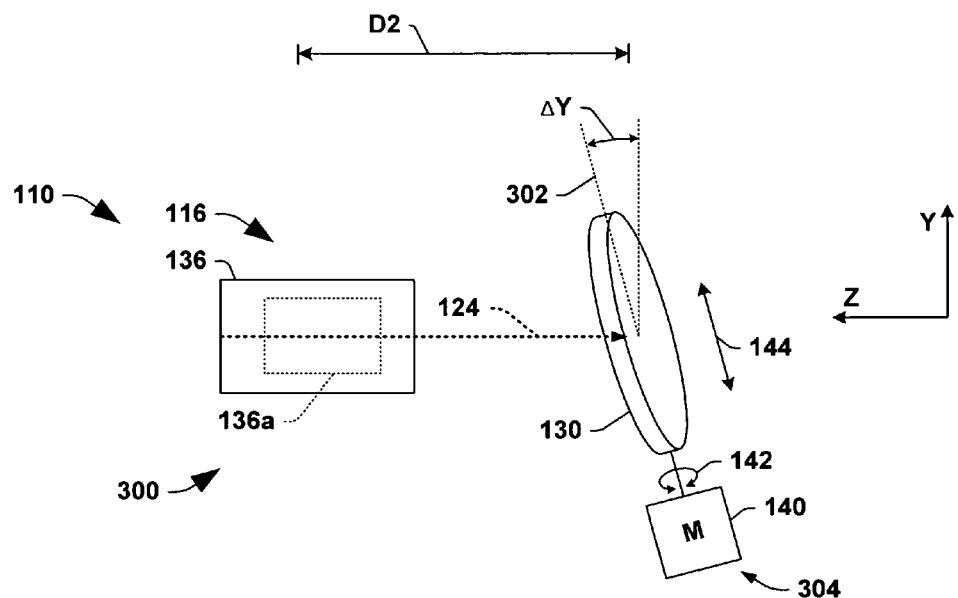
Figure 7J:
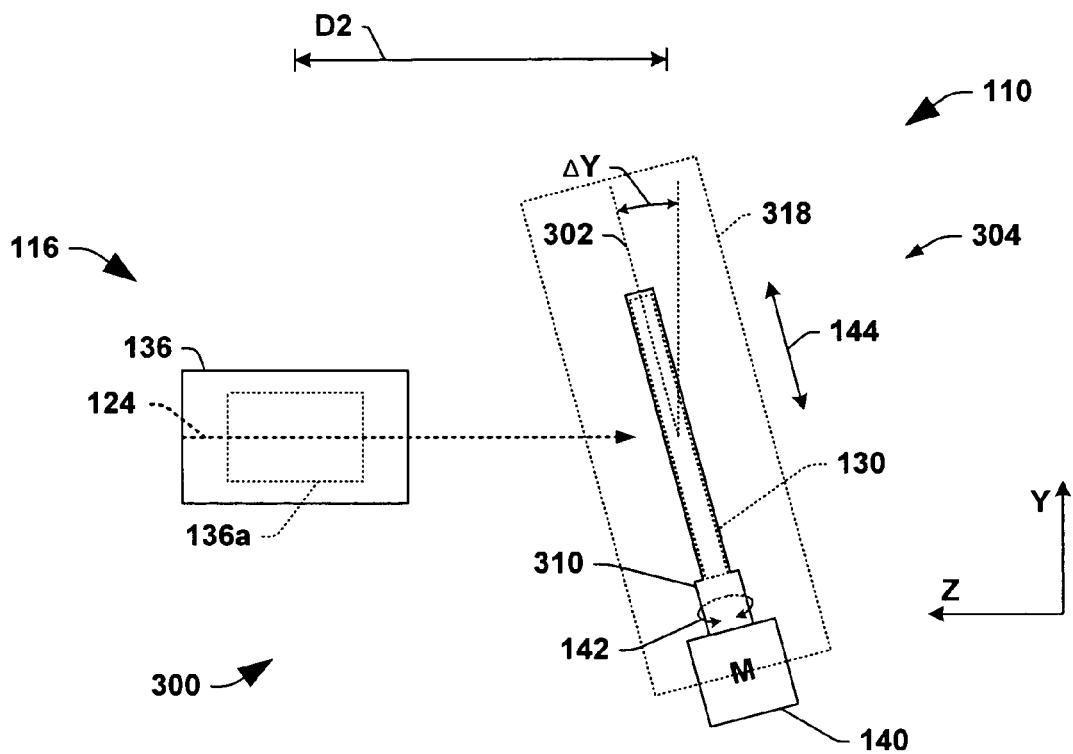
Figure 8A:
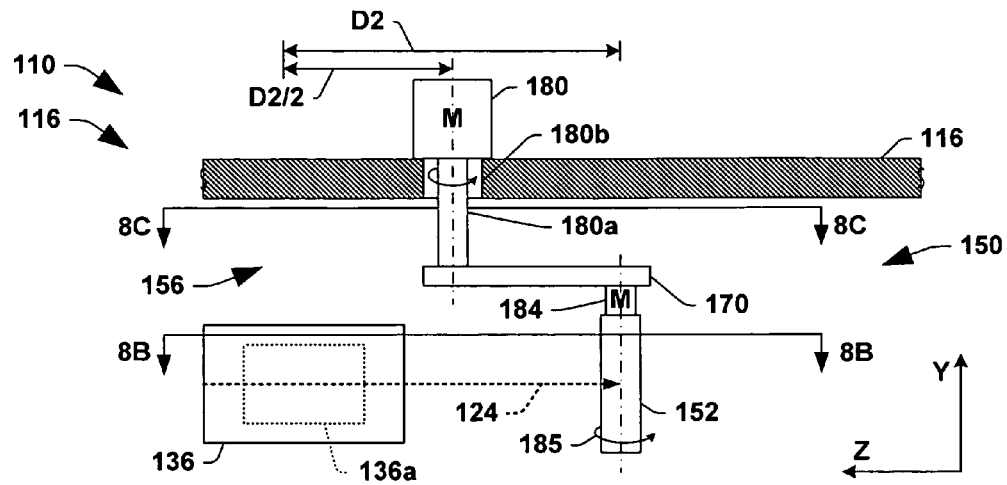
FIGS. 8A–8C are side elevation and top plan views illustrating still another exemplary dosimetry system in the implantation system of FIGS. 2A and 3A in accordance with the invention.
Figure 8B:
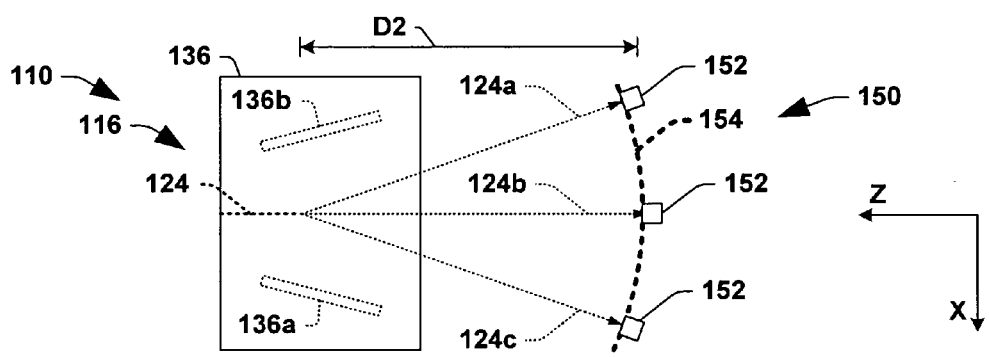
Figure 8C:
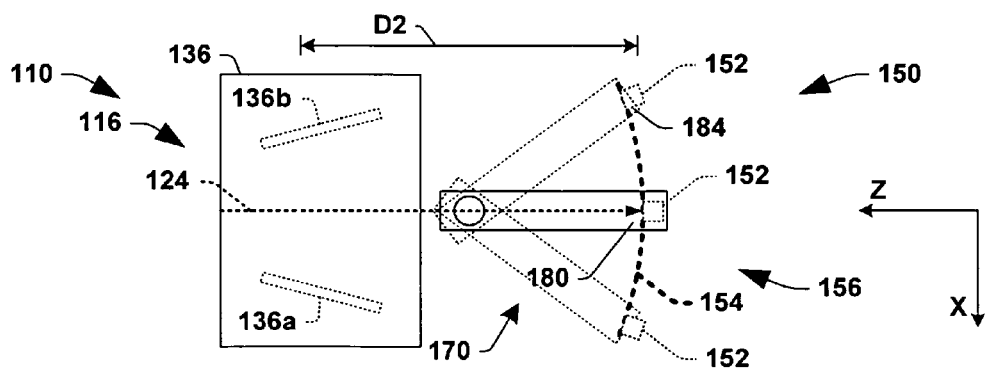

As illustrated in FIG. 7A, the workpiece rotation motor rotates the workpiece 130 about the axis 302 in a manner that is synchronized with the lateral scanning of the ion beam 124 by the beam scanner 136, thereby defining a curvilinear path 154 defining the spatial locations in the process chamber 116 at which the beam 124 strikes the workpiece 130. FIGS. 7A and 7B illustrate two positions of the workpiece 130 along the workpiece scan direction (e.g., two slow scan positions), wherein the focal distance from the workpiece 130 to the beam scanner 136 is maintained substantially constant by virtue of the parallel relationship between the workpiece rotation axis 302 and the workpiece scan direction 144. FIGS. 7D–7I provide top and side elevation views illustrating synchronized operation of the beam scanner 136 and the workpiece scanning system 304 at three exemplary scan/rotation positions for an angled implantation of the workpiece 130.

FIGS. 8A–8C illustrate another exemplary dosimetry system 150 in the implantation system of FIGS. 2A and 3A in accordance with the invention, that may advantageously be employed in conjunction with the scanning systems 300 of FIGS. 2A–2K and 7A–7J for angled or non-angled implants. The dosimetry system 150 of FIGS. 8A–8C comprises a sensor 152, with a simplified mounting apparatus 156 that positions the sensor 152 along the curvilinear path 154. The mounting apparatus 156 comprises an elongated support member 170 having first and second opposite ends, where the first end is pivotally mounted to the process chamber 116 about an axis of a first motor 180, whereby the support member 170 is rotatable at a non-zero angle relative to the horizontal beam scan plane. The sensor 152 is rotatably mounted to the support member 170 via a second motor 184. In the structure of FIGS. 8A–8C, the support member 170 is thus rotatable about the axis of the first motor 180 to position the sensor 152 along various points of the curvilinear path 154, while the sensor 152 can be rotated via the second motor 184 so as to point at the beam scanner vertex. Although not a strict requirement of the invention, the axis of the first motor 180 is positioned approximately midway between the vertex of the beam scanner 136 and the workpiece location in the process chamber 116. As with the above dosimetry systems 150, the motors 180, 184 and the support member 170 may be hollow-shaft, to accommodate routing of signal and/or power wiring between the interior and the exterior of the process chamber 116.

Figure 9A:
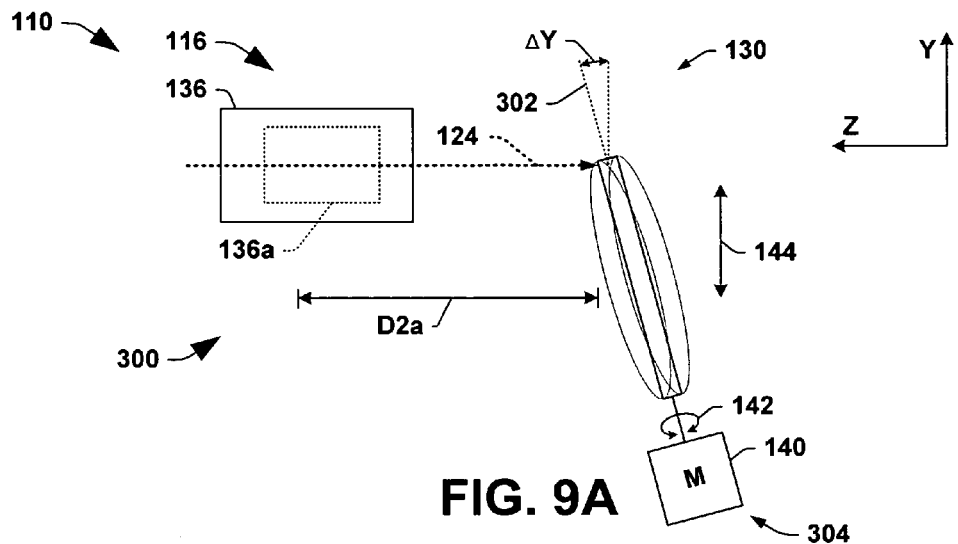
FIGS. 9A–9D are side elevation views illustrating yet another exemplary scanning system in accordance with the present invention, wherein the wafer scan direction is substantially perpendicular to the beam scan plane and the wafer rotation axis is at an oblique angle relative to the beam scan plane.
Figure 9B:
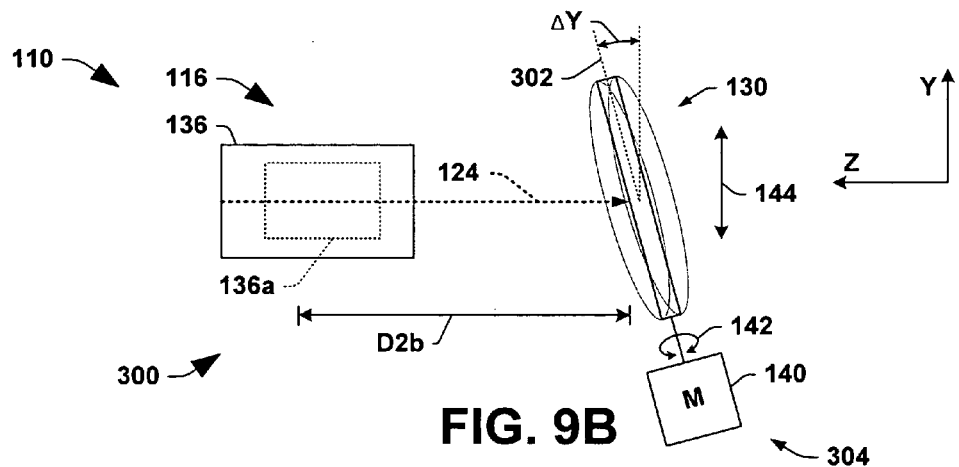
Figure 9C:
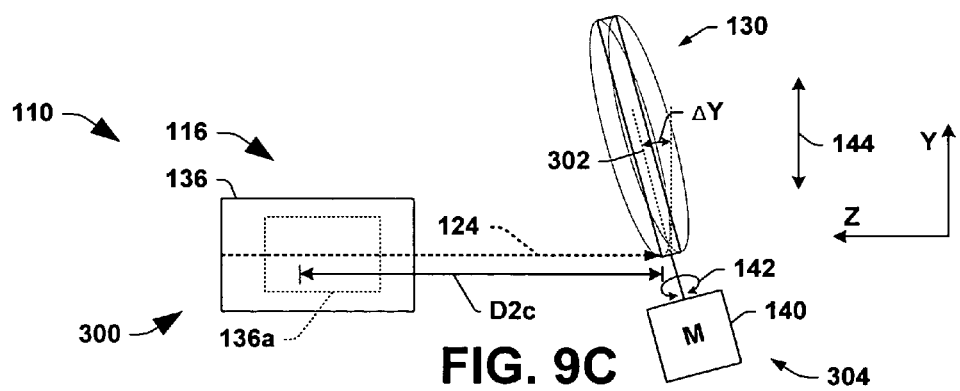
Figure 9D:
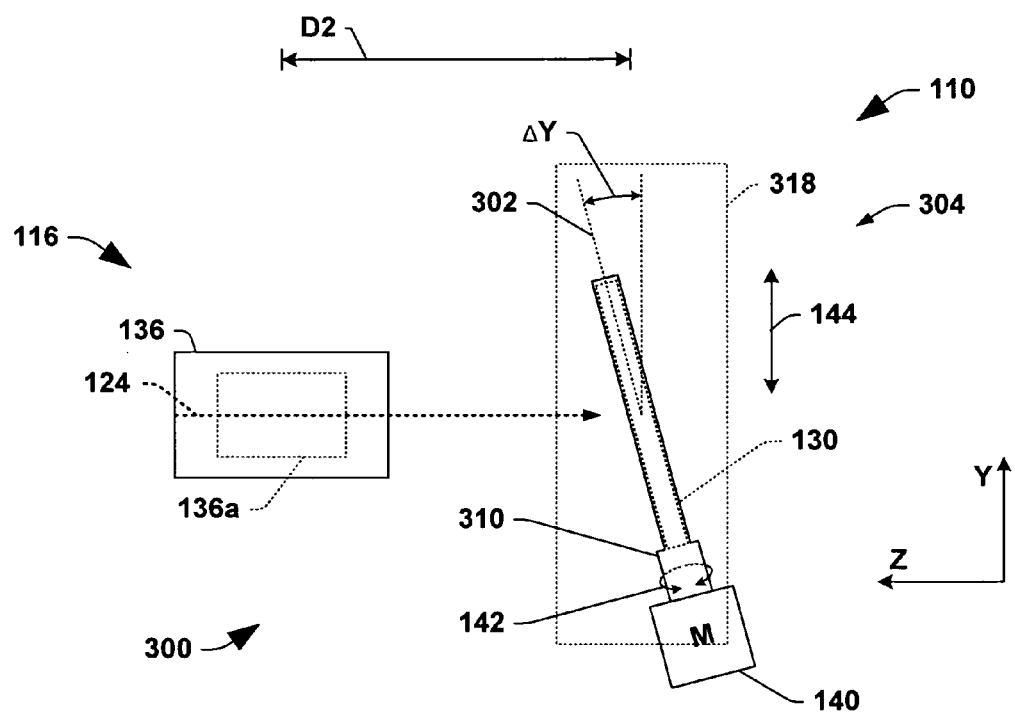

Another possible implementation of the scanning system 300 is illustrated in FIGS. 9A–9D, wherein the wafer scan direction 144 is substantially perpendicular to the scan plane of the ion beam 124 and the wafer rotation axis 302 is at an oblique angle relative to the beam scan plane. Referring also to FIG. 2K, in this example, the shaft 312 is rotatably mounted to the base 318 for rotation about the axis 313 in the direction 320 (FIG. 2K). This allows rotation of the shaft 312, the motor 140, the workpiece support 310, the workpiece 130, and the workpiece rotation axis 302 relative to the beam scan plane to accommodate implantation of the workpiece 130 at a substantially constant, non-orthogonal angle of incidence, wherein the base 318 remains substantially vertical (FIG. 9D), whereby the workpiece scan direction 144 remains orthogonal with respect to the horizontal beam scan plane. FIGS. 9A–9C illustrate the operation of this example at three exemplary workpiece scan (slow scan) positions, wherein the focal distance between the workpiece 130 and the beam scanner 136 changes as the workpiece 130 is translated along the generally vertical direction 144 due to the tilt of the workpiece rotation axis 302 by a tilt angle ΔY.

While the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An ion implantation system, comprising:
    an ion source operable to produce an ion beam;
    a beam scanner adapted to scan the ion beam substantially in a single beam scan plane to provide a scanned ion beam to a workpiece location in a process chamber; and
    a workpiece scanning system located downstream of the beam scanner, the workpiece scanning system being adapted to rotate at least one workpiece at the workpiece location in the process chamber about a first axis that is at a non-zero first angle relative to the beam scan plane, and to translate the at least one workpiece in a workpiece scan direction that is at a non-zero second angle relative to the beam scan plane.

2. The ion implantation system of claim 1, wherein rotation of the workpiece about the first axis is synchronized with the scanning of the ion beam to provide the scanned ion beam to the at least one workpiece at a substantially constant angle of incidence.

3. The ion implantation system of claim 1, wherein the first axis is substantially orthogonal relative to the beam scan plane.

4. The ion implantation system of claim 3, wherein the workpiece scan direction is substantially orthogonal relative to the beam scan plane.

5. The ion implantation system of claim 4, wherein rotation of the workpiece about the first axis is synchronized with the scanning of the ion beam to provide the scanned ion beam to the at least one workpiece at a substantially constant angle of incidence.

6. The ion implantation system of claim 1, wherein the first angle between the first axis and the beam scan plane is variable.

7. The ion implantation system of claim 6, wherein the workpiece scan direction is substantially orthogonal relative to the beam scan plane.

8. The ion implantation system of claim 7, wherein rotation of the workpiece about the first axis is synchronized with the scanning of the ion beam to provide the scanned ion beam to the at least one workpiece at a substantially constant angle of incidence.

9. The ion implantation system of claim 6, wherein the workpiece scan direction is substantially parallel to the first axis.

10. The ion implantation system of claim 9, wherein rotation of the workpiece about the first axis is synchronized with the scanning of the ion beam to provide the scanned ion beam to the at least one workpiece at a substantially constant angle of incidence.

11. The ion implantation system of claim 6, wherein the workpiece scanning system is further adapted to rotate at least one workpiece at the workpiece location in the process chamber about a second axis that is in the beam scan plane so as to tilt the workpiece for angled implants.

12. A scanning system for providing ions from an ion beam to a workpiece, the scanning system comprising:
    a beam scanner receiving an ion beam and scanning the ion beam substantially in a single beam scan plane to provide a scanned ion beam to a workpiece location in a process chamber; and
    a workpiece scanning system located downstream of the beam scanner, the workpiece scanning system being adapted to rotate at least one workpiece at the workpiece location in the process chamber about a first axis that is at a non-zero first angle relative to the beam scan plane, and to translate the at least one workpiece in a workpiece scan direction that is at a non-zero second angle relative to the beam scan plane.

13. The scanning system of claim 12, wherein rotation of the workpiece about the first axis is synchronized with the scanning of the ion beam to provide the scanned ion beam to the at least one workpiece at a substantially constant angle of incidence.

14. The scanning system of claim 12, wherein the first axis is substantially orthogonal relative to the beam scan plane.

15. The scanning system of claim 14, wherein the workpiece scan direction is substantially orthogonal relative to the beam scan plane.

16. The scanning system of claim 12, wherein the first angle between the first axis and the beam scan plane is variable.

17. The scanning system of claim 16, wherein the workpiece scan direction is substantially orthogonal relative to the beam scan plane.

18. The scanning system of claim 16, wherein the workpiece scan direction is substantially parallel to the first axis.

19. A method of implanting a workpiece with ions from an ion beam, the method comprising:
providing an ion beam;
supporting a workpiece at a workpiece location in a process chamber;
scanning the ion beam substantially in a single beam scan plane to provide a scanned ion beam to the workpiece location;
rotating the workpiece about a first axis that is at a non-zero first angle relative to the beam scan plane; and
translating the workpiece in a workpiece scan direction that is at a non-zero second angle relative to the beam scan plane.

20. The method of claim 19, further comprising synchronizing rotating the workpiece about the first axis and scanning the ion beam to provide the scanned ion beam to the at least one workpiece at a substantially constant angle of incidence.

21. The method of claim 19, wherein the first axis is substantially orthogonal relative to the beam scan plane.

22. The method of claim 21, wherein the workpiece scan direction is substantially orthogonal relative to the beam scan plane.

23. The method of claim 19, further comprising adding an offset to the rotation of the workpiece to provide an angled implant.

24. The method of claim 19, further comprising setting the first angle between the first axis and the beam scan plane to an oblique angle to provide an angled implant.

25. The method of claim 24, wherein the workpiece scan direction is substantially orthogonal relative to the beam scan plane.

26. The method of claim 24, wherein the workpiece scan direction is substantially parallel to the first axis.

* * * * *